United States Patent
Leem

(10) Patent No.: US 11,842,067 B2
(45) Date of Patent: Dec. 12, 2023

(54) MEMORY CONTROLLER, MEMORY SYSTEM INCLUDING THE SAME, AND METHOD OF OPERATING THE MEMORY SYSTEM

(71) Applicant: SK hynix Inc., Icheon-si (KR)

(72) Inventor: Jong Soon Leem, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/690,706

(22) Filed: Mar. 9, 2022

(65) Prior Publication Data
US 2023/0120696 A1    Apr. 20, 2023

(30) Foreign Application Priority Data
Oct. 20, 2021    (KR) ................ 10-2021-0140248

(51) Int. Cl.
*G06F 12/00*    (2006.01)
*G06F 3/06*    (2006.01)

(52) U.S. Cl.
CPC .......... *G06F 3/0655* (2013.01); *G06F 3/0619* (2013.01); *G06F 3/0679* (2013.01)

(58) Field of Classification Search
None
See application file for complete search history.

(56) References Cited

U.S. PATENT DOCUMENTS

| 2009/0003058 A1* | 1/2009 | Kang ................ G11C 16/3454 365/185.18 |
| 2018/0189135 A1* | 7/2018 | Naik ................ G11C 29/028 |
| 2021/0304009 A1* | 9/2021 | Bazarsky ............. G06N 3/06 |

FOREIGN PATENT DOCUMENTS

| KR | 1020200076519 A | 6/2020 |
| KR | 1020200095903 A | 8/2020 |

* cited by examiner

*Primary Examiner* — Daniel D Tsui
(74) *Attorney, Agent, or Firm* — WILLIAM PARK & ASSOCIATES LTD.

(57) ABSTRACT

A memory controller includes a read operation controller, an error correction circuit, and a read voltage controller. The read operation controller controls a memory device to read pieces of data from a selected page of the memory device by read voltages having different levels. The error correction circuit determines fail bit numbers of the pieces of data. The read voltage controller selects a reference voltage variation from among voltage variations included in a first read voltage table, based on an erase write cycle count of the memory device, and a reference fail bit number indicating a largest fail bit number of the fail bit numbers, and adjusts a level of each of the read voltages based on the reference voltage variation and a ratio value of a corresponding one of the fail bit numbers to the reference fail bit number.

18 Claims, 18 Drawing Sheets

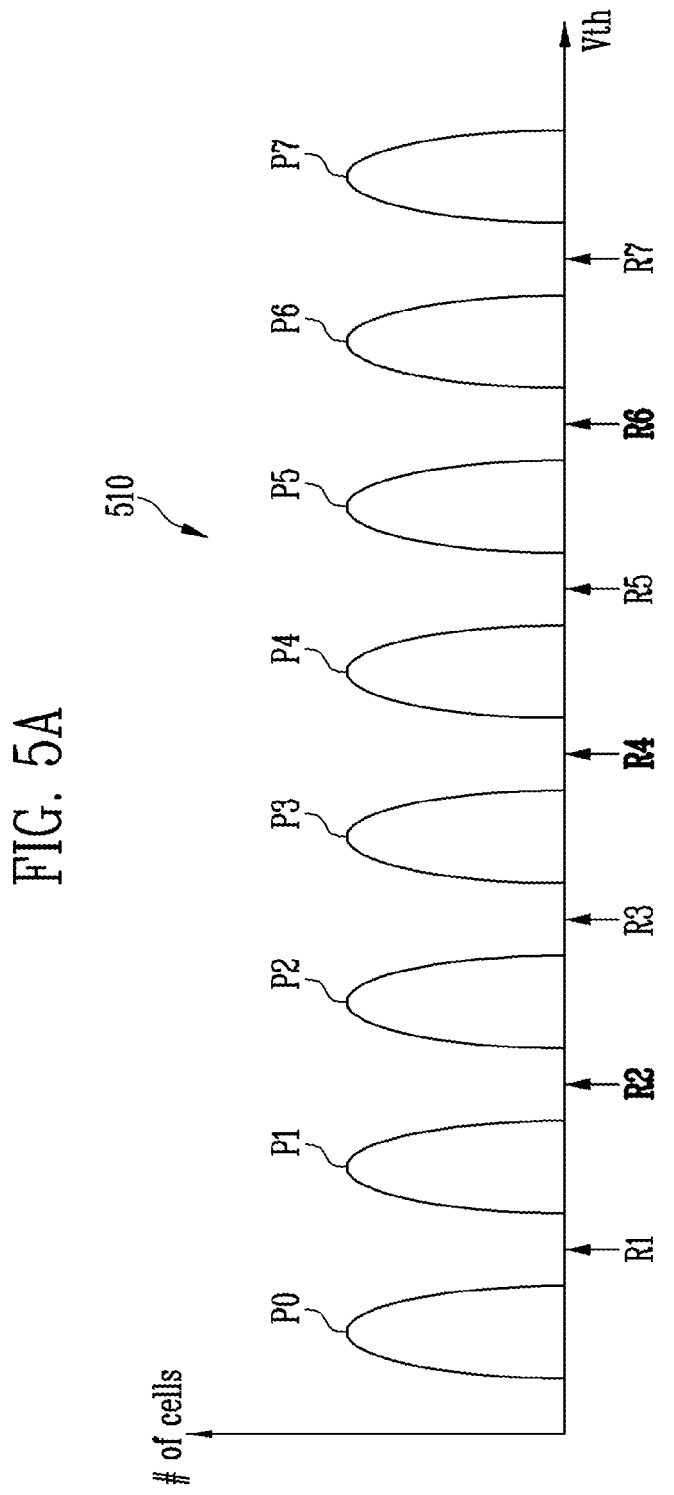

FIG. 5B

| | P0 | P1 | P2 | P3 | P4 | P5 | P6 | P7 |
|---|---|---|---|---|---|---|---|---|
| MSB | 1 | 0 | 0 | 0 | 0 | 1 | 1 | 1 |
| CSB | 1 | 1 | 0 | 0 | 1 | 1 | 0 | 0 |
| LSB | 1 | 1 | 1 | 0 | 0 | 0 | 0 | 1 |

| | | EW Count (#) | | | | |
|---|---|---|---|---|---|---|
| | | 0 | 100 | 1000 | 3000 | ... |
| Va (mV) | -280 | 5000 | 6000 | 6600 | 7300 | ... |
| | -240 | 3000 | 3500 | 3850 | 4200 | ... |
| | -200 | 1600 | 2000 | 2200 | 2400 | ... |
| | -160 | 800 | 1000 | 1100 | 1200 | ... |
| | -120 | 400 | 500 | 550 | 600 | ... |
| | -80 | 250 | 300 | 330 | 360 | ... |
| | -40 | 80 | 100 | 110 | 120 | ... |
| | 0 | 0 | 0 | 0 | 0 | ... |

FIG. 6B

| Va (mV) \ EW Count (#) | 0 | 100 | 1000 | 3000 | ... |
|---|---|---|---|---|---|
| −280 | 5000 | 6000 | 6600 | 7300 | ... |
| −240 | 3000 | 3500 | 3850 | 4200 | ... |
| −200 | 1600 | 2000 | 2200 | 2400 | ... |
| −160 | 800 | 1000 | 1100 | 1200 | ... |
| −120 | 400 | 500 | 550 | 600 | ... |
| −80 | 250 | 300 | 330 | 360 | ... |
| −40 | 80 | 100 | 110 | 120 | ... |
| 0 | 0 | 0 | 0 | 0 | ... |

FIG. 6C

| Va (mV) | Data Type | | |
|---|---|---|---|
| | LSB | CSB | MSB |
| −280 | −280 | −140 | −280 |
| −240 | −240 | −120 | −240 |
| −200 | −200 | −100 | −200 |
| −160 | −160 | −80 | −160 |
| −120 | −120 | −60 | −120 |
| −80 | −80 | −40 | −80 |
| −40 | −40 | −20 | −40 |
| 0 | 0 | 0 | 0 |

FIG. 6D

| | EW Count (#) | | | |
|---|---|---|---|---|
| | 100 | 1000 | 3000 | ... |
| Va (mV) | −280 | −210 | −140 | −70 | ... |
| | −240 | −180 | −120 | −60 | ... |
| | −200 | −150 | −100 | −50 | ... |
| | −160 | −120 | −80 | −40 | ... |
| | −120 | −90 | −60 | −30 | ... |
| | −80 | −60 | −40 | −20 | ... |
| | −40 | −30 | −20 | −10 | ... |
| | 0 | 0 | 0 | 0 | ... |

| Data Type | Read Voltage | Read Retry | | | |
|---|---|---|---|---|---|
| | | RR1 | RR2 | RR3 | ... |
| MSB | R1 | R1_1 | R1_2 | R1_3 | ... |
| CSB | R2 | R2_1 | R2_2 | R2_3 | ... |
| LSB | R3 | R3_1 | R3_2 | R3_3 | ... |
| CSB | R4 | R4_1 | R4_2 | R4_3 | ... |
| MSB | R5 | R5_1 | R5_2 | R5_3 | ... |
| CSB | R6 | R6_1 | R6_2 | R6_3 | ... |
| LSB | R7 | R7_1 | R7_2 | R7_3 | ... |

| Data Type | Read Voltage | Fail Bit | Read Retry | | |
|---|---|---|---|---|---|
| | | | RR1 | RR2 | RR3 |
| MSB | R1 | FBIT_1 | R1_1+Vt1 | R1_2+Vt1 | R1_3+Vt1 |
| CSB | R2 | FBIT_2 | R2_1+Vt2 | R2_2+Vt2 | R2_3+Vt2 |
| LSB | R3 | FBIT_3 | R3_1+Vt3 | R3_2+Vt3 | R3_3+Vt3 |
| CSB | R4 | FBIT_4 | R4_1+Vt4 | R4_2+Vt4 | R4_3+Vt4 |
| MSB | R5 | FBIT_5 | R5_1+Vt5 | R5_2+Vt5 | R5_3+Vt5 |
| CSB | R6 | FBIT_6 | R6_1+Vt6 | R6_2+Vt6 | R6_3+Vt6 |
| LSB | R7 | FBIT_7 | R7_1+Vt7 | R7_2+Vt7 | R7_3+Vt7 |

FIG. 7C $$Vt2 = \frac{FBIT\_2}{\max(FBIT\_2, FBIT\_4, FBIT\_6)} \times Va$$

$$Vt4 = \frac{FBIT\_4}{\max(FBIT\_2, FBIT\_4, FBIT\_6)} \times Va$$

$$Vt6 = \frac{FBIT\_6}{\max(FBIT\_2, FBIT\_4, FBIT\_6)} \times Va$$

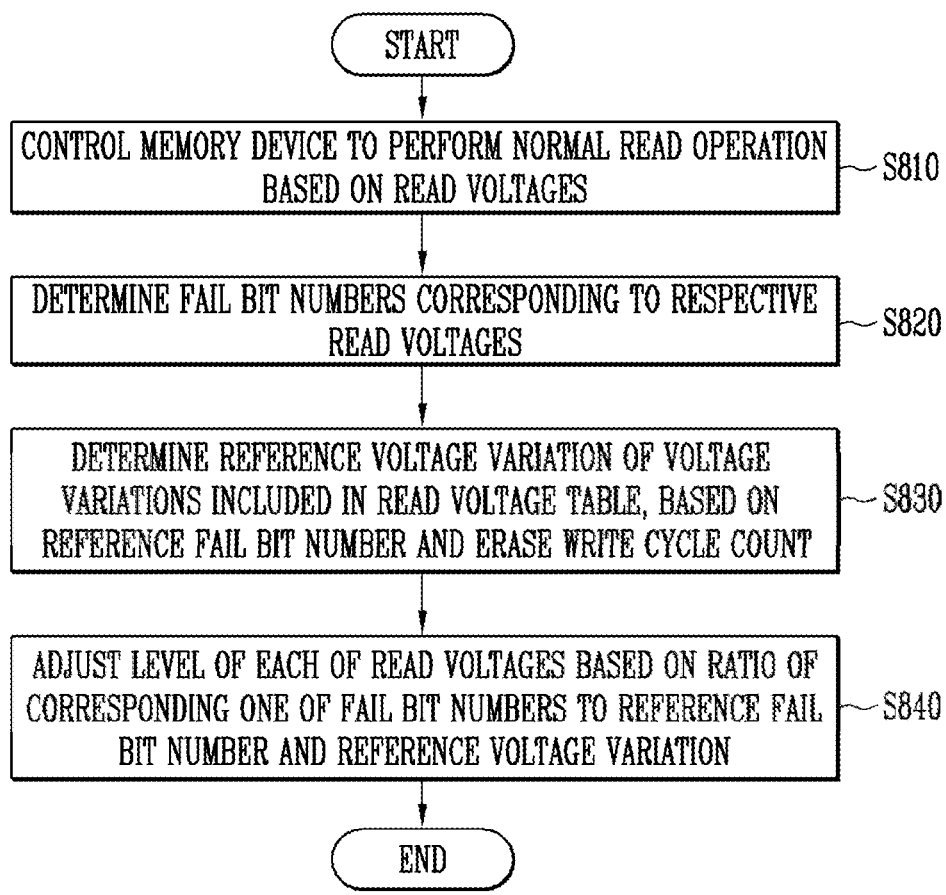

MEMORY CONTROLLER, MEMORY SYSTEM INCLUDING THE SAME, AND METHOD OF OPERATING THE MEMORY SYSTEM

CROSS-REFERENCE TO RELATED APPLICATION

The present application claims priority under 35 U.S.C. § 119(a) to Korean patent application number 10-2021-0140248 filed on Oct. 20, 2021, in the Korean Intellectual Property Office, the entire disclosure of which is incorporated by reference herein.

BACKGROUND

1. Technical Field

Various embodiments of the present disclosure generally relate to an electronic device, and more particularly, to a memory controller, a memory system including the memory controller, and a method of operating the memory system.

2. Related Art

A memory system is a device which stores data under the control of a host such as a computer or a smartphone. The memory system may include a memory device configured to store data and a memory controller configured to control the memory device. Memory devices may be classified as volatile memory devices or nonvolatile memory devices.

A volatile memory device is a memory device which stores data only when power is supplied thereto and in which data stored therein is lost when power is turned off. Examples of a volatile memory device include a static random access memory (SRAM) device and a dynamic random access memory (DRAM) device.

A nonvolatile memory device is a memory device in which data stored therein is maintained even when power is turned off. Examples of a nonvolatile memory device include a read-only memory (ROM) device, a programmable ROM (PROM) device, an electrically programmable ROM (EPROM) device, an electrically erasable programmable ROM (EEPROM) device, and a flash memory device.

SUMMARY

Various embodiments of the present disclosure are directed to a memory controller capable of correctly reading data stored in a memory device, and a memory system including the memory controller, and a method of operating the memory system.

In accordance with an embodiment of the present disclosure is a memory controller including: a read operation controller configured to control a memory device to read pieces of data from a selected page of the memory device by a plurality of read voltages having different levels; an error correction circuit configured to determine fail bit numbers of the pieces of data, each of fail bit numbers indicating a number of failed bits included in one of the pieces of data; and a read voltage controller. The read voltage controller is configured to: select a reference voltage variation from among a plurality of voltage variations included in a first read voltage table, based on an erase write cycle count of the memory device, and a reference fail bit number indicating a largest fail bit number of the fail bit numbers; and adjust a level of each of the plurality of read voltages based on the reference voltage variation and a ratio value of a corresponding one of the fail bit numbers to the reference fail bit number.

In accordance with an embodiment of the present disclosure is a memory system including a memory device including a plurality of pages. The memory system also includes a memory controller configured to: control the memory device to apply a plurality of read voltages having different levels to a selected page of the plurality of pages; determine a reference voltage variation of a plurality of voltage variations included in a read voltage table, based on an erase write cycle count of the memory device, and a reference fail bit number indicating a largest fail bit number of fail bit numbers obtained by the respective read voltages; and adjust a level of each of the plurality of read voltages, based on a ratio value of a corresponding one of the fail bit numbers to the reference fail bit number and the reference voltage variation.

A method of operating a memory controller in accordance with the present disclosure includes: controlling a memory device to perform a normal read operation based on a plurality of read voltages having different levels; determining fail bit numbers respectively corresponding to the plurality of read voltages, each of fail bit numbers indicating a number of failed bits included in one of the pieces of data; determining a reference voltage variation of a plurality of voltage variations included in a read voltage table, based on an erase write cycle count of the memory device, and a reference fail bit number indicating a largest fail bit number of the fail bit numbers; and adjusting a level of each of the plurality of read voltages, based on a ratio value of a corresponding one of the fail bit numbers to the reference fail bit number and the reference voltage variation.

BRIEF DESCRIPTION OF THE DRAWINGS

FIG. 5A is a diagram for describing distributions of threshold voltages of memory cells in accordance with an embodiment.

FIG. 5B is a diagram for describing a Gray code in accordance with an embodiment.

FIGS. 6A and 6B are diagrams for describing a first read voltage table in accordance with an embodiment.

FIG. 6C is a diagram for describing a second read voltage table in accordance with an embodiment.

FIG. 6D is a diagram for describing a third read voltage table in accordance with an embodiment.

FIG. 7A is a diagram for describing a read voltage of a read retry operation in accordance with an embodiment.

FIGS. 7B and 7C are diagrams for describing a method of adjusting the read voltage of the read retry operation in accordance with an embodiment.

FIG. 8 is a diagram for describing a method of operating a memory controller in accordance with an embodiment.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Figure 1:
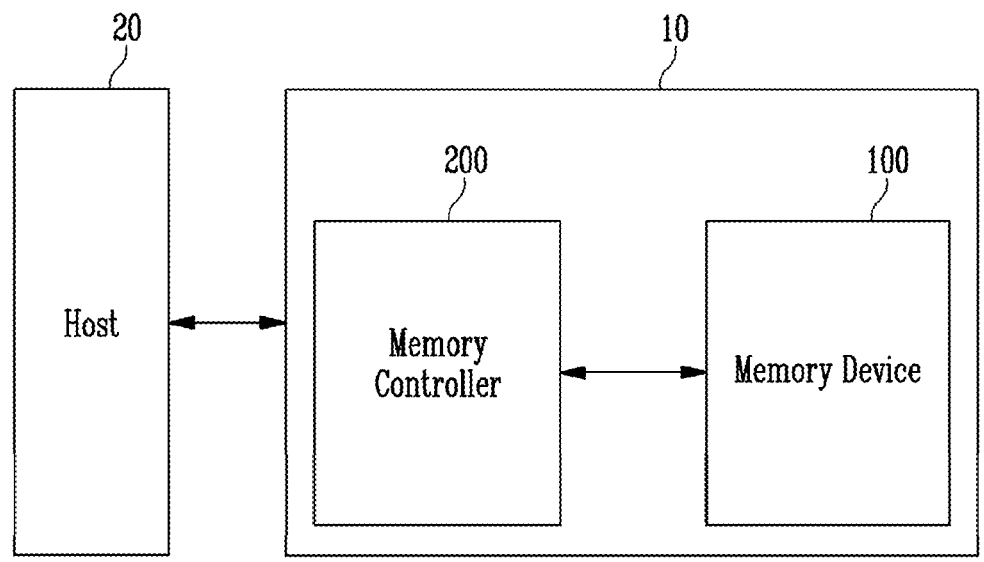
FIG. 1 is a diagram for describing a memory system in accordance with an embodiment.

FIG. 1 is a diagram for describing a memory system 10 in accordance with an embodiment.

Referring to FIG. 1, the memory system 10 may be operated in response to various requests from a host 20. In detail, the memory system 10 may perform an operation corresponding to a request received from the host 20. For example, if the memory system 10 receives data and a request to store the data, the memory system 10 may store the data. For instance, if the memory system 10 receives a request to read data from the host 20, the memory system 10 may provide the data stored in the memory system 10 to the host 20. To this end, the memory system 10 may be connected with the host 20 by various communication schemes.

The memory system 10 may be implemented as any one of various kinds of storage devices depending on communication protocols or a scheme of storing data. For example, the memory system 10 may be implemented as any one of a solid state disk (SSD), multi-media card (MMC), embedded MMC (eMMC), reduced-size MMC (RS-MMC), or micro-MMC type storage device, a universal serial bus (USB) storage device, a universal flash storage (UFS) device, a personal computer memory card international association (PCMCIA) type storage device, a peripheral component interconnection (PCI) type storage device, a PCI express (PCI-E) type storage device, a network attached storage, and a wireless network storage device. Here, the listed examples are only examples, and the present disclosure is not limited thereto. The memory system 10 may be implemented as various storage devices.

The host 20 may be one of various electronic devices such as a desktop computer, a laptop computer, a smartphone, a game console, a television (TV), a tablet computer, and a wearable device. The host 20 may perform communication with the memory system 10 according to various communication protocols. The host 20 may transmit data, a logical address, or various requests to the memory system 10, or receive data from the memory system 10.

The memory system 10 may be used as a main memory device or an auxiliary memory device of the host 20. The memory system 10 may be located inside the host 20 or outside the host 20.

The memory system 10 may include a memory device 100 and a memory controller 200. The memory device 100 may be one or more. The memory device 100 and the memory controller 200 may be connected to each other by a channel. The memory device 100 and the memory controller 200 may transmit and receive a command, an address, data, etc. therebetween through the channel.

The memory device 100 may store data therein. To this end, the memory device 100 may be implemented using various types of semiconductor memory. Such memory may include, for example, NAND flash memory, vertical NAND flash memory, NOR flash memory, static random access memory (SRAM), dynamic RAM (DRAM), synchronous dynamic RAM (SDRAM), double data rate (DDR) SDRAM, low power DDR (LPDDR) SDRAM, graphics DRAM (GDRAM), rambus dynamic RAM (RDRAM), ferro electric RAM (FeRAM), magnetoresistive RAM (MRAM), phase change memory (PCM), spin transfer torque magnetoresistive RAM (STT-MRAM), resistive RAM (ReRAM), etc. Hereinafter, for the sake of explanation, it is assumed that the memory device 100 is a NAND flash memory device.

The memory device 100 may include at least one memory block. The memory block may include a plurality of pages. Each page may include a plurality of memory cells. In other words, the memory device 100 may include a plurality of memory cells. Each memory cell may be defined as the smallest unit configured to store data. In an embodiment, the memory cell may be implemented as a transistor including a gate, an insulating layer, and a floating gate. For example, if a program voltage is applied to the gate of the memory cell, electrons may be stored in the floating gate of the memory cell by a tunneling phenomenon. In this case, the threshold voltage of the memory cell may vary depending on the amount of electrons stored in the floating gate. The threshold voltage of the memory cell may belong to one program state of a plurality of program states having different voltage ranges. The program state of the memory cell may refer to a value of data stored in the memory cell.

The memory device 100 may store data according to one of various data storage schemes. For example, the data storage scheme may be one of a single-level cell (SLC) storage scheme, a multi-level cell (MLC) storage scheme, and a triple-level cell (TLC) storage scheme. The SLC storage scheme may be a scheme in which one bit may be stored in one memory cell. For example, in the case of the SLC, one of two binarized values such as '1' and '0' may be stored in one memory cell. A value stored in the memory cell may be recognized based on which program state among two program states a present program state of the memory cell is depending on the threshold voltage. The MLC storage scheme may be a scheme in which two bits may be stored in one memory cell. For example, in the case of the MLC, one of four binarized values including '11' to '00' may be stored in one memory cell. A value stored in the memory cell may be recognized based on which program state among four program states a present program state of the memory cell is depending on the threshold voltage. The TLC storage scheme may be a scheme in which three bits may be stored in one memory cell. For example, in the case of the TLC, one of eight binarized values including '111' to '000' may be stored in one memory cell. A value stored in the memory cell may be recognized based on which program state among eight program states a present program state of the memory cell is depending on the threshold voltage.

The memory controller 200 may control overall operations of the memory device 100. For example, the memory controller 200 may control the memory device 100 to perform a program operation of storing data, a read operation of requesting stored data, or an erase operation of erasing stored data.

For example, in the case of the program operation, the memory controller 200 may provide a program command, an address, and data to the memory device 100. Here, the address may refer to a physical address. If the program command, the address, and the data are received from the memory controller 200, the memory device 100 may perform a program operation of storing the data in a page determined by the address. In the case of the read operation, the memory controller 200 may provide a read command and an address to the memory device 100. If the read command and the address are received from the memory controller 200, the memory device 100 may perform a read operation of providing data stored in a page determined by the address to the memory controller 200. In the case of the erase operation, the memory controller 200 may provide an erase command and an address to the memory device 100. If the erase command and the address are received from the memory controller 200, the memory device 100 may perform an erase operation of erasing data in a memory block determined by the address.

In an embodiment, the memory controller 200 may control the memory device 100 to perform a program operation, a read operation, or an erase operation in response to a request from the host 20. For example, if a request to store data, a request to read data, or a request to erase data is received from the host 20, the memory controller 200 may generate a command corresponding to the storage request, the read request, or the erase request. If a logical address is received from the host 20, the memory controller 200 may convert the logical address to a physical address. Here, the physical address may be a unique identifier which refers to a memory block or a page included in the memory device 100. The memory controller 200 may transmit a physical address along with a command to the memory device 100. The physical address may be simply designated as an "address."

In an embodiment, the memory controller 200 may control the memory device 100 to autonomously perform a program operation, a read operation, or an erase operation regardless of a request from the host 20. For example, the memory controller 200 may control the memory device 100 to perform a wear leveling operation, a read reclaim operation, or a garbage collection operation. To this end, the memory controller 200 may autonomously generate a command, an address, and data, and transmit the command, the address, and the data to the memory device 100.

In a case for which two or more bits are stored in one memory cell, two or more pieces of page data may be stored in one page including a plurality of memory cells. For example, in the case of the TLC, three bits may be stored in one memory cell. The three bits may include a least significant bit (LSB), a center significant bit (CSB), and a most significant bit (MSB) which are classified according to the type of data. In this case, three pieces of page data such as LSB page data, CSB page data, and MSB page data may be stored in one page. Here, the LSB page data may include LSBs stored in respective memory cells included in the page. The CSB page data may include CSBs stored in the memory cells included in the page. The MSB page data may include MSBs stored in the memory cells included in the page. For instance, in the case of the MLC, two bits such as an LSB and an MSB may be stored in one memory cell. In this case, two pieces of page data such as LSB page data and MSB page data may be stored in one page.

In this case, the memory controller 200 may control memory device 100 to perform a read operation using at least one read voltage to read one piece of page data.

Here, the number of read voltages may refer to a count of application of a read voltage. The number of read voltages required to read page data may be changed depending on the type of data. For example, in the case of the TLC, two read voltages may be required to read LSB page data (or MSB page data), while three read voltages may be required to read CSB page data. In other words, there is a high probability that the CSB page data is not normally read compared to that of the LSB page data (or the MSB page data) because the count of application of read voltages in the CSB page data is greater than that of the LSB page data (or the MSB page data). The MLC also has the same problem as the foregoing because one read voltage is required for one of the LSB page data and the MSB page data and two read voltages are required for the other one. Hereinafter, for the sake of explanation, it is assumed that the data storage scheme is a TLC storage scheme.

In accordance with an embodiment of the present disclosure, the memory controller 200 may determine a reference voltage variation of a plurality of voltage variations included in a read voltage table, based on a reference fail bit number and an erase write cycle count.

In detail, the memory controller 200 may control the memory device 100 to apply a plurality of read voltages having different levels to a selected page of a plurality of pages. The memory controller 200 may determine a reference voltage variation of a plurality of voltage variations included in the read voltage table, based on a reference fail bit number that refers to the largest fail bit number of fail bit numbers obtained by the respective read voltages and on an erase write cycle count of the selected page. The memory controller 200 may adjust the level of each of the plurality of read voltages, based on a ratio value of a corresponding one of the fail bit numbers to the reference fail bit number and the reference voltage variation.

Here, the reference fail bit number may refer to the largest fail bit number of fail bit numbers of data obtained by the respective read voltages. The memory controller 200 may adjust the level of each of the plurality of read voltages, based on a ratio value of a corresponding one of the fail bit numbers to the reference fail bit number and the reference voltage variation.

As such, the memory controller 200 may correctly read data stored in the memory device 100 by individually adjusting each read voltage depending on the type of data, etc. However, embodiments of the present disclosure will be described in detail with reference to the accompanying drawings.

Figure 2A:
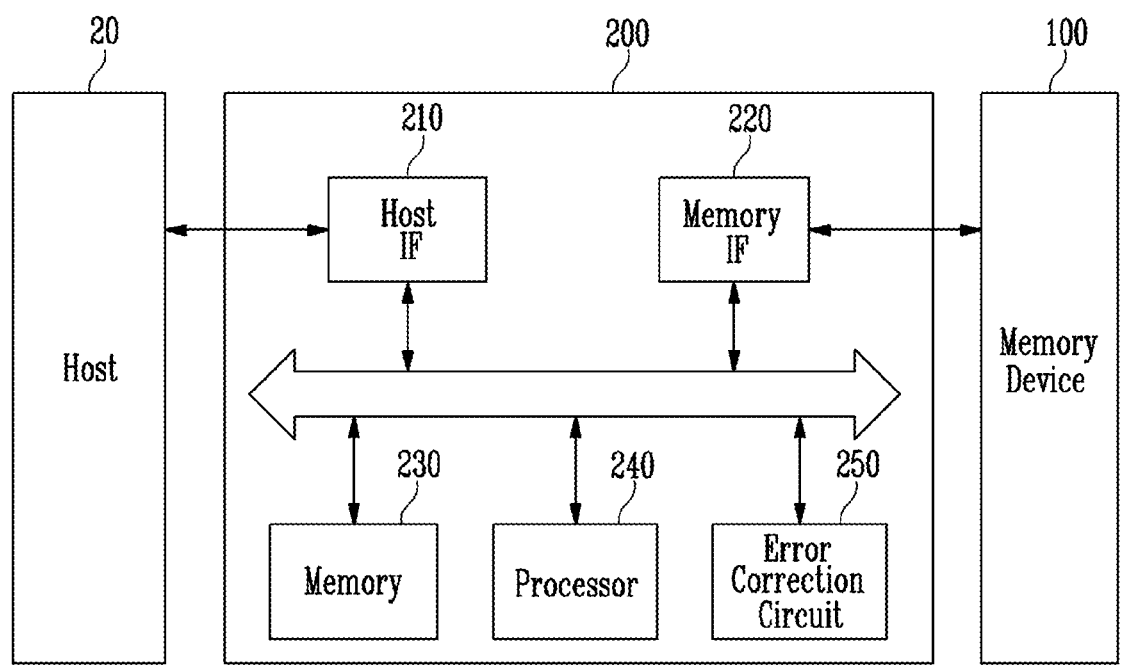
FIG. 2A is a diagram for describing a structure of a memory controller in accordance with an embodiment.

FIG. 2A is a diagram for describing a structure of the memory controller 200 in accordance with an embodiment.

Referring to FIG. 2A, the memory controller 200 may include at least one of a host interface 210, a memory interface 220, memory 230, a processor 240, and an error correction circuit 250.

The host interface 210 may communicate with the host 20 using various communication protocols. For example, the host interface 210 may communicate with the host 20 using various communication protocols such as a universal serial bus (USB), a multimedia card (MMC), an embedded MMC (eMMC), peripheral component interconnection (PCI), PCI-express (PCI-E), advanced technology attachment (ATA), serial-ATA (SATA), parallel-ATA (PATA), a small computer system interface (SCSI), an enhanced small disk interface (ESDI), integrated drive electronics (IDE), Firewire, a universal flash storage (UFS), and a universal asynchronous receiver/transmitter (UART).

The host interface 210 may transceive various kinds of information with the host 20. The host interface 210 may provide, to the processor 240 or the memory 230, information received from the host 20. The host interface 210 may provide information stored in the memory 230 to the host 20.

In the case of a program operation, if a write request for data, a logical address, and data are received from the host 20, the host interface 210 may transmit the write request and the logical address to the processor 240, and transmit the data to the memory 230.

In the case of a read operation, if a read request for data and a logical address are received from the host 20, the host interface 210 may transmit the read request and the logical address to the processor 240. Thereafter, the host interface 210 may transmit data read from the memory device 100 to the host 20.

The memory interface 220 may communicate with the memory device 100 through a channel. The memory interface 220 may transceive various kinds of information with the memory device 100. The memory interface 220 may provide, to the processor 240 or the memory 230, information received from the memory device 100. The memory interface 220 may provide information stored in the memory 230 to the memory device 100.

In the case of a program operation, the memory interface 220 may receive a program command and a physical address from the processor 240 and receive data from the memory 230. In this case, the memory interface 220 may transmit a program command, a physical address, and data to the memory device 100. Here, the data may be data encoded by the error correction circuit 250.

In the case of the read operation, if a read command and a physical address are received from the processor 204, the memory interface 220 may transmit the read command and the physical address to the memory device 100. Thereafter, the memory interface 220 may transmit data read from the memory device 100 to the memory 230.

The memory 230 may temporarily store data received from the memory device 100 or the host 20. Here, the data may be data to be stored in the memory device 100 in response to a program command, or data to be provided to the host 20 in response to a read command. After the data that is temporarily stored in the memory 230 is stored in the memory device 100 or the data that is temporarily stored in the memory 230 is provided to the host 20, the memory 230 may erase the temporarily stored data.

The memory 230 may store data needed for operation or management of the memory controller 200. For example, the memory 230 may receive and store a read retry table read from a system memory block of a content addressable memory (CAM) block of the memory device 100.

To this end, the memory 230 may include at least one of static random access memory (static RAM; SRAM) and dynamic RAM (DRAM). In an embodiment, one area of the memory 230 may be configured as a working memory of the memory controller 200, and also be used as a cache memory. In an embodiment, the memory 230 may store various instructions to be used to perform operations of the processor 240.

The processor 240 may control overall operations of the memory controller 200.

The processor 240 may execute an instruction if power is supplied thereto. For example, the processor 240 may execute the instruction to read an address mapping table stored in the memory device 100 and store the address mapping table in the memory 230. The address mapping table may include mapping information between logical addresses and physical addresses. Subsequently, if a logical address is received from the host 20, the processor 240 may search for a physical address mapped to the logical address received from the host 20, in the mapping table stored in the memory 230.

In the case of a program operation, if a write request and a logical address are received from the host 20, the processor 240 may determine a physical address mapped to the received logical address among physical addresses included in the address mapping table. The processor 240 may control the memory interface 220 to transmit a program command, the physical address, and data to the memory device 100. Here, the data may be page data encoded by the error correction circuit 250. If the program command, the physical address, and the data are received, the memory device 100 may store the data in a selected page corresponding to the physical address.

In the case of the read operation, if a read request and a logical address are received from the host 20, the processor 240 may determine a physical address mapped to the received logical address among physical addresses included in the address mapping table. The processor 240 may control the memory interface 220 to transmit a read command and the physical address to the memory device 100. If the read command and the physical address are received, the memory device 100 may read data stored in a selected page corresponding to the physical address and provide the data to the memory controller 200. The processor 240 may control the host interface 210 to transmit the data received from the memory device 100 to the host 20. The data received from the memory device 100 may be data that is temporarily stored in the memory 230.

In an embodiment, if the read operation fails, the processor 240 may control the memory device 100 to adjust the level of the read voltage according to a read retry scheme and then perform the read operation. The processor 240 may control the memory device 100 to iterate the operation of adjusting the level of the read voltage and performing the read operation until the read operation succeeds.

For example, the case where the read operation fails may indicate that a fail bit number of the read data received from the memory device 100 exceeds a threshold value. The case where the read operation succeeds may indicate that the fail bit number of the read data is the threshold value or less. Here, the read data may refer to data obtained by reading, using a read voltage, the data stored in the selected page corresponding to the logical address among the plurality of pages included in the memory device 100. The fail bit number may refer to the number of fail bits included in the read data. The threshold value may indicate an error correction capability of the error correction circuit 250.

In an embodiment, the memory device 100 may store a plurality of pieces of page data in one page. In other words, the memory device 100 may store two or more bits in each of the memory cells included in one page depending on a storage scheme such as the MLC or TLC storage scheme. In this case, the processor 240 may control the memory device 100 to read one page data using at least one read voltage.

For example, in the case of the TLC, LSB page data, CSB page data, and MSB page data may be stored in one page. Here, the processor 240 may control the memory device 100 to perform the read operation using a read voltage set corresponding to each piece of page data. The read voltage set may include at least one read voltage. For example, the processor 240 may control the memory device 100 to read LSB page data using a first read voltage set. The processor 240 may control the memory device 100 to read CSB page data using a second read voltage set. The processor 240 may control the memory device 100 to read MSB page data using a third read voltage set. Here, the first read voltage set may include two read voltages having different levels. The second read voltage set may include three read voltages having different levels. The third read voltage set may include two read voltages having different levels In accordance with an embodiment of the present disclosure, if a read operation using a plurality of read voltages fails, the processor 240 may control the memory device 100 to adjust the level of each of the plurality of read voltages and perform the read operation. Here, the processor 240 may determine a voltage variation using the read voltage table including a plurality of voltage variations, based on a fail bit number corresponding each read voltage, and an erase write cycle count.

In detail, the processor 240 may determine a reference voltage variation of the plurality of voltage variations included in the read voltage table, based on the reference fail bit number and the erase write cycle count. Here, the reference fail bit number may refer to the largest fail bit number of fail bit numbers of data obtained by the respective read voltages on the selected page. The erase write cycle count may refer to the number of times program operations or erase operations have been performed on the selected page. The memory controller 200 may adjust the level of each of the plurality of read voltages, based on a ratio value of a corresponding one of the fail bit numbers to the reference fail bit number and the reference voltage variation.

For example, the case where the CSB page data is read using three read voltages will be described. In this case, if a read operation for the CSB page data succeeds, the processor 240 may provide the CSB page data received from the memory device 100 to the host 20.

Unlike this, if the read operation for the CSB page data fails, the processor 240 may perform the read operation according to a read retry scheme. In other words, if the fail bit number of the CSB page data received from the memory device 100 exceeds the threshold value, the processor 240 may control the memory device 100 to adjust the levels of the three read voltages and perform the read operation. Here, the processor 240 may iterate the foregoing operation until the fail bit number of the read CSB page data is the threshold value or less.

The error correction circuit 250 may determine a fail bit number of data. In detail, the error correction circuit 250 may detect fail bits included in data received from the memory device 100. In this case, the error correction circuit 250 may determine the fail bit number of the data, and transmit the fail bit number to the processor 240. Here, the fail bit number may refer to the number of fail bits included in the data. A fail bit may refer to a memory cell of which a program state read out using a read voltage has changed because of disturbance, retention, or an increase in erase write cycle count. In other words, in a case for which a value stored in the memory cell differs from a value read from the memory cell, the error correction circuit 250 may set the corresponding memory cell to a fail bit.

In case of the program operation, the error correction circuit 250 may perform an operation of encoding data to be stored in the memory device 100. The encoded data may be provided to the memory device 100 by the memory interface 220. In case of the read operation, the error correction circuit 250 may perform an operation of decoding data received from the memory device 100. The error correction circuit 250 may determine a fail bit number of the decoded data.

In an embodiment, the error correction circuit 250 may use a parity bit included in the encoded data to detect a fail bit of the data For example, the error correction circuit 250 may use various schemes such as a parity check, a block sum check, and a cycle redundancy check (CRC) to detect the fail bit included in the data. The encoded data may be data obtained by adding a parity bit to the original data received from the host 20. The parity bit may be a bit that is used to detect or correct the fail bit of the data. The parity bit may be inserted into a preset position among the bits of the original data. For example, in a case for which the original data is formed of bit groups each including a predetermined number of bits, a parity bit may be inserted into a specific position such as a start portion or an end portion of each group. Here, the parity bit may have a value determined to set the number of 0s or 1s included in the group to an odd number or an even number.

In an embodiment, the error correction code circuit 250 may perform an encoding operation or a decoding operation, using a low density parity check (LDPC) code, a Bose, Chaudhri, Hocquenghem (BCH) Code, a turbo code, a Reed-Solomon code, a convolution code, a recursive systematic code (RSC), or coded modulation such as trellis-coded modulation (TCM), block coded modulation (BCM), or hamming code.

The error correction circuit 250 may correct fail bits of the data. In detail, the error correction circuit 250 may correct fail bits of the data if a fail bit number of the data is a reference number or less. Here, the reference number may indicate the capability to correct the fail bits. In other words, the error correction circuit 250 may not correct fail bits of the data if the fail bit number of the data exceeds the reference number.

Figure 2B:
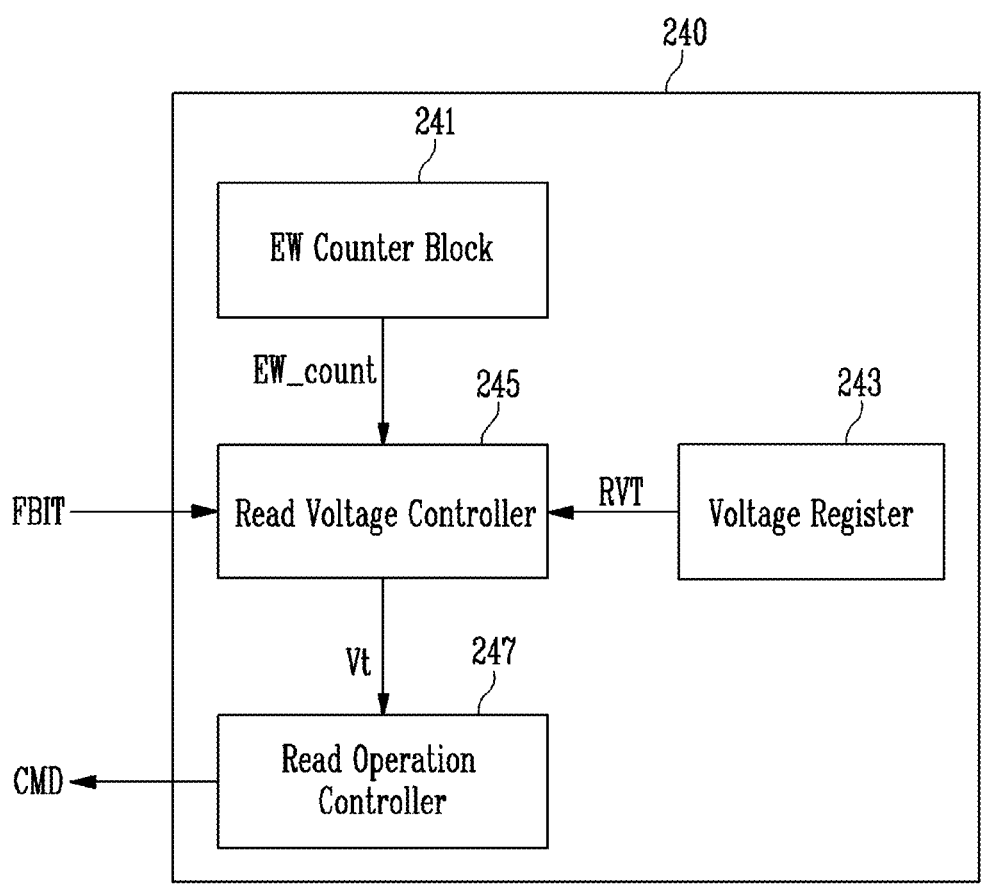
FIG. 2B is a diagram for describing a detailed configuration of a processor in accordance with an embodiment.

FIG. 2B is a diagram for describing a detailed configuration of the processor 240 in accordance with an embodiment.

In an embodiment, the processor 240 may include an erase write counter block 241, a voltage register 243, a read voltage controller 245, and a read operation controller 247.

The erase write counter block 241 may store an erase write cycle count EW_count of the memory device 100. The erase write cycle count EW_count may indicate the number of times the memory device 100 has performed erase operations or program operations. The erase write cycle count EW_count may be managed on a memory block or page basis. The erase write counter block 241 may output the erase write cycle count EW_count to the read voltage controller 245 to adjust the level of a read voltage.

The voltage register 243 may store at least one read voltage table RVT therein. The at least one read voltage table RVT may include a first read voltage table, a second read voltage table, and/or a third read voltage table.

In an embodiment, the voltage register 243 may store a first read voltage table therein. The first read voltage table may be a table indicating a mapping relationship between an erase write cycle count, a reference fail bit number, and a voltage variation. In detail, the first read voltage table may include first field values corresponding to an erase write cycle count, second field values mapped to the first field values and corresponding to the reference fail bit number, and a plurality of voltage variations mapped to the second field values.

In an embodiment, the voltage register 243 may store a second read voltage table therein. The second read voltage table may be a table indicating a mapping relationship between the type of data, a reference voltage variation, and a second voltage variation. In detail, the second read voltage table may include third field values corresponding to the types of data, fourth field values corresponding to the reference voltage variation, and second voltage variations mapped to the third field values and the fourth field values.

In an embodiment, the voltage register 243 may store a third read voltage table therein. The third read voltage table may be a table indicating a mapping relationship between an erase write cycle count, a reference voltage variation, and a third voltage variation. In detail, the third read voltage table may include fifth field values corresponding to an erase write cycle count, sixth field values corresponding to the reference voltage variation, and third voltage variations mapped to the sixth field values and the fifth field values.

In an embodiment, a difference between third voltage variations mapped to the fifth field value indicating a first erase write cycle count among the fifth field values may be greater than a difference between third voltage variations mapped to a fifth field value indicating a second erase write cycle count greater than the first erase write cycle count.

Detailed explanation of the first to third read voltage tables will be described with reference to FIGS. 6A to 6D.

The read voltage controller 245 may select one voltage variation from the read voltage table RVT, based on the erase write cycle count EW_count and the fail bit count FBIT. Here, the fail bit number FBIT may be divided into fail bit numbers for respective read voltages included in a read voltage set.

In detail, if the fail bit number FBIT of page data read using the read voltage set including a plurality of read voltages exceeds the threshold value, the read voltage controller 245 may set the largest fail bit number among the fail bit numbers for the respective read voltages to a reference fail bit number. Here, the plurality of read voltages may be voltages to read the same type of data. In an embodiment, the fail bit number FBIT may be received from the error correction circuit 250. In an embodiment, the fail bit number FBIT may be received from the memory device 100.

The read voltage controller 245 may select, the reference voltage variation, a voltage variation that matches the reference fail bit number and the erase write cycle count EW_count, among a plurality of voltage variations included in the read voltage table RVT.

In an embodiment, the read voltage controller 245 may determine a reference voltage variation using the first read voltage table. In detail, the read voltage controller 245 may select a first field value having the smallest difference between it and the erase write cycle count, among the first field values. The read voltage controller 245 may select a second field value that is mapped to the selected first field value and has the smallest difference between it and the reference fail bit number, among the second field values. The read voltage controller 245 may select, as the reference voltage variation, a voltage variation mapped to the selected second field value among the plurality of voltage variations.

The read voltage controller 245 may adjust, using the reference voltage variation, the level of each of the plurality read voltages.

In detail, the read voltage controller 245 may adjust the level of each of the plurality of read voltages, based on a ratio value of a corresponding one of the fail bit numbers to the reference fail bit number, and the reference voltage variation. The read voltage controller 245 may output read voltage information Vt of each of the plurality of read voltages. In an embodiment, the read voltage information Vt may refer to the level of the read voltage. For example, in a case for which the read voltage information Vt is 1.6 V, a voltage of 1.6 V may be applied to a selected page during a read operation. In an embodiment, the read voltage information Vt may refer to a level by which a default level of the read voltage is to be adjusted. For example, in a case for which the default level of the read voltage is 2 V and the read voltage information Vt is −0.4 V, a voltage of 1.6 V may be applied to the selected page during the read operation.

For instance, in a case for which the read page data is CSB page data and the read voltage set includes a first read voltage, a second read voltage, and a third read voltage, the fail bit number FBIT may be divided into a first fail bit number for the first read voltage, a second fail bit number for the second read voltage, and a third fail bit number for the third read voltage. The fail bit number FBIT of the read page data may be the sum of the first fail bit number, the second fail bit number, and the third fail bit number. Here, if the second fail bit number is largest, the second fail bit number is determined as the reference fail bit number.

In this case, the read voltage controller 245 may adjust the level of the first read voltage to a value obtained by multiplying a ratio value of the first fail bit number to the reference fail bit number by the reference voltage variation. The read voltage controller 245 may adjust the level of the second read voltage to a value obtained by multiplying a ratio value of the second fail bit number to the reference fail bit number by the reference voltage variation. The read voltage controller 245 may adjust the level of the third read voltage to a value obtained by multiplying a ratio value of the third fail bit number to the reference fail bit number by the reference voltage variation.

Although the reference voltage variation has been described as being multiplied by the ratio value, this is only for illustrative purposes. In accordance with the present disclosure, a final voltage variation may be determined using the reference voltage variation, and a value obtained by multiplying the final voltage variation by the ratio value may be used.

In an embodiment, the read voltage controller 245 may determine a reference voltage variation based on the first read voltage table, and then determine a final voltage variation based on the second read voltage table.

In detail, the read voltage controller 245 may select a third field value corresponding to the type of data among the third field values included in the second read voltage table. The read voltage controller 245 may select a fourth field value corresponding to the reference voltage variation among the fourth field values included in the second read voltage table. The read voltage controller 245 may select, as the final voltage variation, a second voltage variation mapped to the selected third field value and the selected fourth field value among the second voltage variations included in the second read voltage table. In this case, the read voltage controller 245 may adjust the level of each of the plurality of read voltages to a value obtained by multiplying the second voltage variation that is the final voltage variation by a corresponding one of the ratio values.

In an embodiment, the read voltage controller 245 may determine a reference voltage variation based on the first read voltage table, and then determine a final voltage variation based on the third read voltage table.

In detail, the read voltage controller 245 may select a fifth field value having the smallest difference between it and the erase write cycle count, among the fifth field values included in the third read voltage table. The read voltage controller 245 may select a sixth field value corresponding to the reference voltage variation among the sixth field values included in the third read voltage table. The read voltage controller 245 may select, as the final voltage variation, a third voltage variation mapped to the selected fifth field value and the selected sixth field value among the third voltage variations included in the third read voltage table. The read voltage controller 245 may adjust the level of each of the plurality of read voltages to a value obtained by multiplying the third voltage variation that is the final voltage variation by a corresponding one of the ratio values.

The read operation controller 247 may control the memory device 100 to perform a normal read operation or a read operation according to the read retry scheme. Here, the normal read operation may refer to an operation of reading data using a read voltage having a level set to a default.

In an embodiment, the read operation controller 247 may control the memory device 100 to read pieces of data respectively using a plurality of read voltages having adjusted levels. For example, the read operation controller 247 may transmit a command CMD and read voltage information Vt about the respective read voltages to the memory device 100. Here, the command CMD may be a read command provided to control the pieces of data to be respectively read by the plurality of read voltages having the adjusted levels according to the read voltage information Vt about the respective read voltages.

Although the erase write counter block 241, the voltage register 243, the read voltage controller 245, and the read operation controller 247 have been described as being included in the processor 240, this is only an embodiment. At least one of the erase write counter block 241, the voltage register 243, the read voltage controller 245, and the read operation controller 247 may be a component provided separately from the processor 240.

Figure 3:
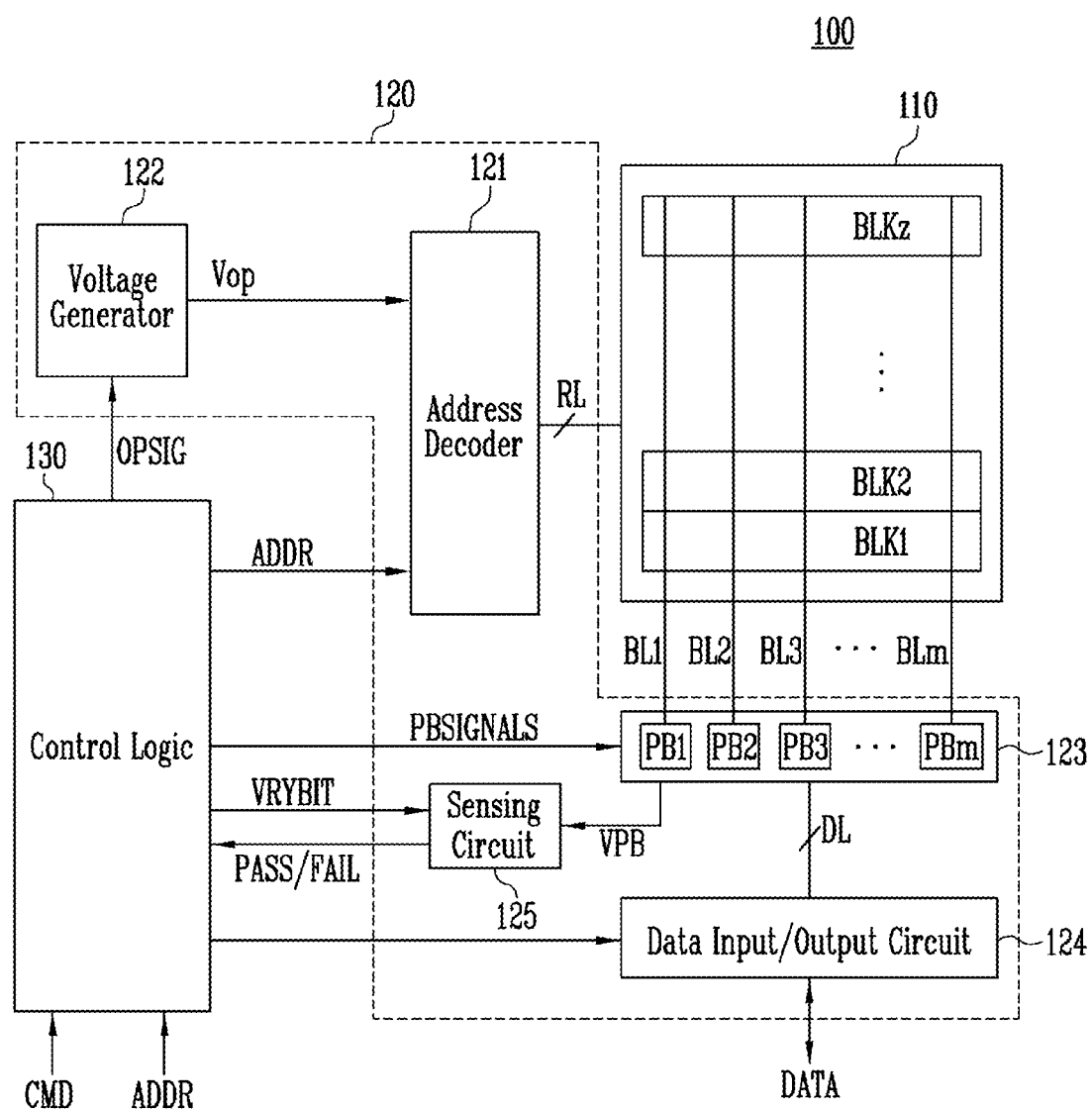
FIG. 3 is a diagram for describing a structure of a memory device in accordance with an embodiment.

FIG. 3 is a diagram for describing a structure of the memory device 100 in accordance with an embodiment.

Referring to FIG. 3, the memory device 100 may include a memory cell array 110, a peripheral circuit 120, and control logic 130.

The memory cell array 110 may include a plurality of memory blocks BLK1 to BLKz. Each of the memory blocks may have the same structure. Hereinafter, for the sake of explanation, any one memory block BLKz of the plurality of memory blocks BLK1 to BLKz will be described.

The memory block BLKz may include a plurality of pages. Each page may include memory cells. In other words, the memory block BLKz may include a plurality of memory cells.

The plurality of memory cells may be disposed on a two-dimensional plane, or disposed in a three-dimensional vertical structure. Here, the memory cell may be a semiconductor memory element. In an embodiment, the memory cell may be a nonvolatile memory element.

The memory block BLKz may be connected to an address decoder 121 of the peripheral circuit 120 by a row line RL. Here, the row line RL may include a plurality of word lines. Each page of the memory block BLKz may be connected to one word line. In other words, the memory cells included in each page of the memory block BLKz may be connected to one word line. Each of the pages included in the memory block BLKz may be connected to bit lines BL1 to BLm. The bit lines BL1 to BLm may be respectively connected to page buffers PB1 to PBm of the peripheral circuit 120. A detailed structure of the memory block BLKz will be described with reference to FIG. 4.

The peripheral circuit 120 may operate under the control of the control logic 130. For example, the peripheral circuit 120 may drive the memory cell array 110 to perform a program operation, a read operation, or an erase operation.

The peripheral circuit 120 may include an address decoder 121, a voltage generator 122, a read/write circuit 123, a data input/output circuit 124, and a sensing circuit 125.

The address decoder 121 may be connected to the memory cell array 110 by the row line RL. For example, referring to FIGS. 3 and 4, the row line RL may include a drain select line DSL, a plurality of word lines WL1 to WL16, a source select line SSL, and a source line SL. For example, the address decoder 121 may include components such as a row decoder, a column decoder, and an address buffer.

The address decoder 121 may operate under the control of the control logic 130. For example, the address decoder 121 may receive an address ADDR from the control logic 130. The address decoder 121 may decode a block address or a page address included in the received address ADDR. Here, the page address may refer to a row address. The address decoder 121 may apply an operating voltage Vop provided from the voltage generator 122 to a memory block indicated by the block address or a page indicated by the page address. Here, the operating voltage Vop may include at least one of a program voltage, a verify voltage, a program pass voltage, a verify pass voltage, a read voltage, a read pass voltage, and first and second erase voltages.

The voltage generator 122 may generate various kinds of operating voltages Vop using an external power supply supplied to the memory device 100. Here, the external power supply may be a preliminary power supply included in the memory system 10 or a power supply of the host 20. The operating voltage Vop may include at least one of a program voltage, a verify voltage, a program pass voltage, a verify pass voltage, a read voltage, a read pass voltage, and first and second erase voltages. The voltage generator 122 may operate under the control of the control logic 130. For example, if an operating signal OPSIG is received from the control logic 130, the voltage generator 122 may transmit an operating voltage Vop corresponding to the operating signal OPSIG to the address decoder 121.

The read/write circuit 123 may include a plurality of page buffers PB1 to PBm. Each of the plurality of page buffers PB1 to PBm may be connected to the memory cell array 110 by a corresponding bit line of the plurality of bit lines BL1 to BLm. For example, each of the plurality of page buffers PB1 to PBm may be connected, by a corresponding bit line, in common to memory cells that refer to a specific column among the memory cells included in each of the plurality of memory blocks BLK1 to BLKz. Each of the plurality of page buffers PB1 to PBm may temporarily store data DATA. To this end, each of the plurality of page buffers PB1 to PBm may be implemented as various memory elements such as a latch circuit.

The read/write circuit 123 may operate under the control of the control logic 130. In an embodiment, if a buffer control signal PBSIGNALS is received from the control logic 130, the read/write circuit 123 may apply a voltage corresponding to data DATA to each of the plurality of bit lines BL1 to BLm, or sense a voltage of each of the plurality of bit lines BL1 to BLm to read data DATA. As such, data DATA that is temporarily stored in the plurality of page buffers PB1 to PBm may be stored in a specific area of the memory cell array 110, or data DATA that is stored in a specific area of the memory cell array 110 may be read and temporarily stored in the plurality of page buffers PB1 to PBm. Here, the specific area may be a page which is indicated by a page address.

The data input/output circuit 124 is connected to the read/write circuit 123 by a data line DL. The data input/output circuit 124 may include a plurality of input/output buffers configured to receive input data DATA. The data input/output circuit 124 may operate in a response to a control signal of the control logic 130. For example, if a control signal is received from the control logic 130, the data input/output circuit 124 may output data DATA that is temporarily stored in the data input/output circuit 124 to the read/write circuit 123 through the data line DL, or output data DATA that is temporarily stored in the data input/output circuit 124 to the memory controller 200 through the channel.

The sensing circuit 125 may generate a reference voltage in response to an enable bit signal VRYBIT received from the control logic 130. The sensing circuit 125 may output a pass signal PASS or a fail signal FAIL to the control logic 130 depending on a result of comparison of the reference voltage and a sensing voltage VPB received from the read/write circuit 123. Here, the pass signal PASS may indicate a success of a program pulse operation or a success of a read operation. The fail signal FAIL may indicate a failure of the program pulse operation or a failure of the read operation.

The control logic 130 may be implemented as hardware, software, or a combination of hardware and software. For example, the control logic 130 may be a control logic circuit operating in accordance with an algorithm and/or a processor executing control logic code. The control logic 130 may control overall operations of the memory device 100. The control logic 130 may control the peripheral circuit 120 to perform a program operation, a read operation, or an erase operation, in response to a command CMD and an address ADDR that are received from the memory controller 200. Here, the command CMD may be a program command, a read command, or an erase command. To this end, the control logic 130 may be connected to the peripheral circuit 120. For example, the control logic 130 may be connected to the address decoder 121, the voltage generator 122, the read/write circuit 123, the data input/output circuit 124, and the sensing circuit 125.

In an embodiment, if a program command and an address ADDR are received from the memory controller 200, the control logic 130 may control the peripheral circuit 120 to perform a program operation of storing data DATA in a selected page corresponding to the address ADDR. Here, the data DATA may include at least one piece of page data. For example, in the case of the TLC, the data DATA may include LSB page data, CSB page data, and MSB page data. For instance, in the case of the MLC, the data DATA may include LSB page data and MSB page data.

The program operation may be an operation of storing data according to an incremental step pulse program (ISPP) scheme. For example, the program operation may include a plurality of program loops. Each program loop may include a program pulse operation and a program verify operation which are successively performed. The program pulse operation may be an operation of applying a program voltage to a selected page to change the threshold voltage. The program verify operation may be an operation of applying a verify voltage to the selected page to verify whether the program pulse operation has succeeded or failed. If a result of the verify operation indicates a success of the program pulse operation, the control logic 130 may terminate the program operation. If the result of the verify operation indicates a failure of the program pulse operation, the control logic 130 may control the peripheral circuit 120 to increase the level of the program voltage and then perform a program loop.

In an embodiment, if a read command and an address ADDR are received from the memory controller 200, the control logic 130 may control the peripheral circuit 120 to perform a read operation of reading data DATA stored in a selected page corresponding to the address ADDR. The control logic 130 may control the peripheral circuit 120 to transmit the data DATA read from the selected page to the memory controller 200.

For example, if a read command and an address ADDR are received from the memory controller 200, the control logic 130 may control the peripheral circuit 120 to successively apply a plurality of read voltages corresponding to the type of page data to a selected page corresponding to the address ADDR. The control logic 130 may control the peripheral circuit 120 to transmit the read page data to the memory controller 200.

In this case, if a read command and read voltage information are received from the memory controller 200, the control logic 130 may control the peripheral circuit 120 to apply a plurality of read voltages of which the respective levels are adjusted depending on the read voltage information to the selected page. The control logic 130 may control the peripheral circuit 120 to transmit the read page data to the memory controller 200.

Some of the memory blocks BLK1 to BLKz may include a system memory block or a CAM block. The system memory block or the CAM block may store information about operations of the memory device 100. For example, the information about the operations of the memory device 100 may include a default level of a program voltage, a default level of a read voltage, information about a bad block, a fail bit number, etc.

Figure 4:
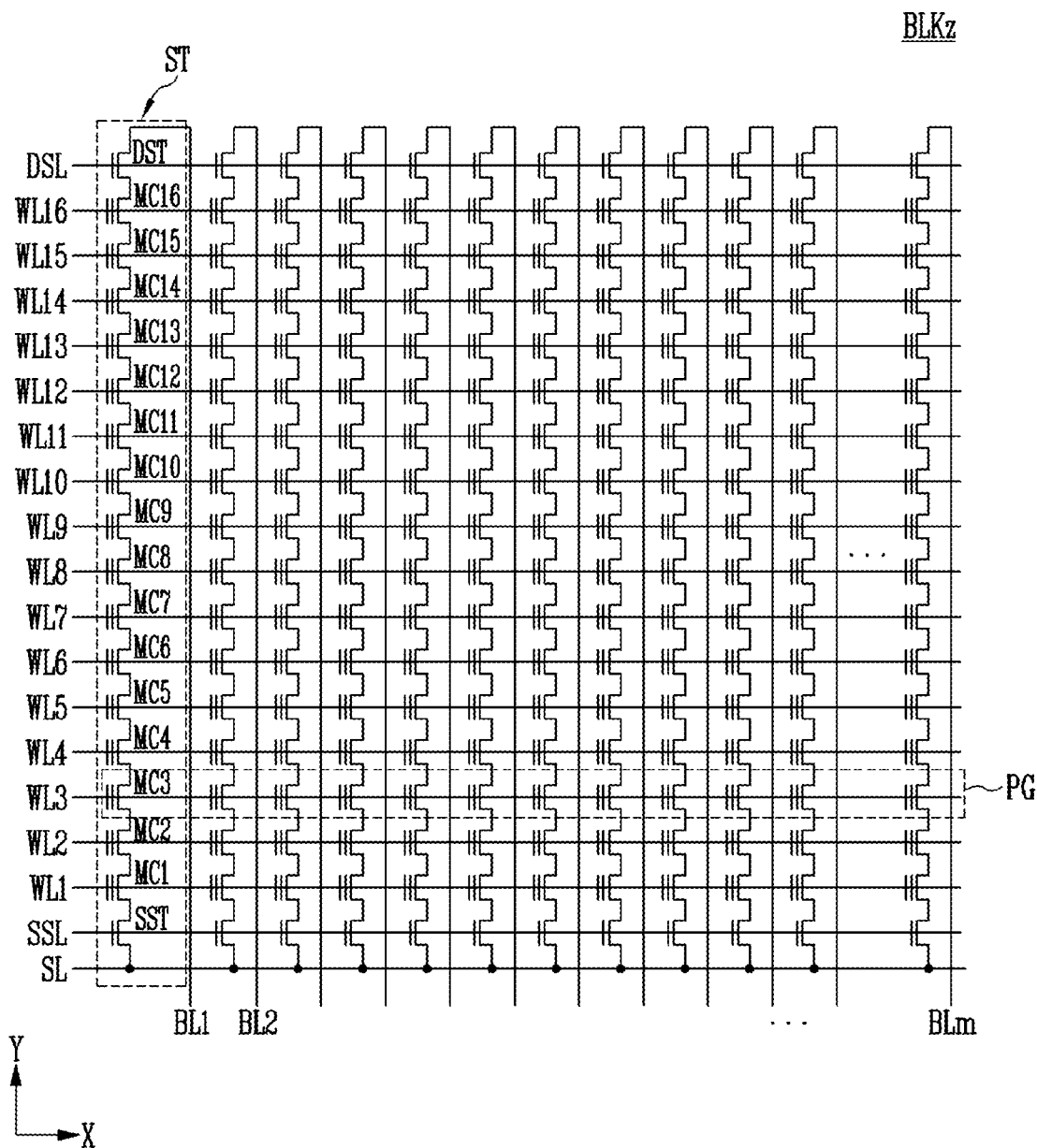
FIG. 4 is a diagram for describing a structure of a memory block in accordance with an embodiment.

FIG. 4 is a diagram for describing a structure of the memory block BLKz in accordance with an embodiment.

Referring to FIG. 4, the memory block BLKz may include a plurality of strings. The plurality of strings may have the same configuration; therefore, the string ST that is connected to the first bit line BL1 will be described by way of example.

Any one end of the string ST may be connected to the first bit line BL1 that is one bit line of the plurality of bit lines BL1 to BLm. The other end of the string ST may be connected to a source line SL. Here, the one source line SL may be connected in common to the plurality of strings. Each bit line may be connected to one string.

The string ST may include a source select transistor SST, a plurality of memory cells MC1 to MC16, and a drain select transistor DST which are connected in series to each other between the source line SL and the first bit line BL1. In an embodiment, at least one source select transistor SST and at least one drain select transistor DST may be included in the string ST, and the number of memory cells included in the string ST may be greater than the number of memory cells MC1 to MC16 shown in the drawing.

Gates of the source select transistors SST may be connected to the source select line SSL. Gates of the drain select transistors DST may be connected to the drain select line DSL. A source of the source select transistor SST may be connected to the source line SL, and a drain of the drain select transistor DST may be connected to the first bit line BL1.

Gates of the plurality of memory cells MC1 to MC16 may be respectively connected to the plurality of word lines WL1 to WL16. The plurality of memory cells MC1 to MC16 may be connected in series between the source select transistor SST and the drain select transistor DST.

The memory block BLKz may include a plurality of pages. Each page PG may be defined as a group of memory cells connected in common to the same word line. Here, the page PG may be a group of memory cells corresponding to a basis on which a program operation or a read operation is performed. The memory block BLKz may be a group of memory cells corresponding to a basis on which an erase operation is performed.

The page PG may store at least one piece of page data. The number of pieces of page data may be determined depending on the number of bits of data to be stored in a memory cell. For example, in the case of the SLC in which one bit of data is stored in one memory cell, one piece of page data may be stored in one page PG. In the case of the MLC in which two bits of data are stored in one memory cell, two pieces of page data may be stored in one page PG. In the case of the TLC in which three bits of data are stored in one memory cell, three pieces of page data may be stored in one page PG.

FIG. 5A is a diagram for describing distributions of threshold voltages of memory cells in accordance with an embodiment.

Referring to FIG. 5A, the plurality of memory cells included in the selected page may form a threshold voltage distribution 510 in which a program state may be distinguished by the read voltages R1 to R7. Each of a plurality of memory cells may have one program state of a plurality of program states P0 to P7 depending on a threshold voltage thereof. The plurality of program states P0 to P7 illustrated in FIG. 5A represent an example of the TLC. If the data storage scheme is changed to the SLC or MLC storage scheme, the program states may vary.

Depending on a result of application of a read voltage to a selected page, the memory device 100 may determine a program state of each of memory cells included in the page. Here, in the case of the TLC, the memory device 100 may use seven read voltages to determine the program state of the memory cell as one of eight program states. In the case the MLC, the memory device 100 may use three read voltages to determine the program state as one of four program states. For example, as illustrated in FIG. 5A, in a case for which the data storage scheme is the TLC storage scheme, the plurality of program states P0 to P7 may include a zeroth program state P0 to a seventh program state P7. Here, the zeroth program state P0 may be an erase state.

In detail, the memory device 100 may apply a first read voltage R1 to a selected page and apply a pass voltage to an unselected page. Here, a channel through which current is able to flow may be formed in a memory cell having a threshold voltage less than the level of the first read voltage R1. Here, the memory cell having a threshold voltage less than the level of the first read voltage R1 may operate as an ON cell through which current may flow. On the other hand, a channel may not be formed in a memory cell having a threshold voltage equal to or greater than the level of the first read voltage R1. Here, the memory cell having a threshold voltage equal to or greater than the level of the first read voltage R1 may operate as an OFF cell through which current does not flow. In this case, the memory device 100 may determine that the program state of the memory cell that is the ON cell is the zeroth program state P0.

The memory device 100 may apply a second read voltage R2 to the selected page and apply a pass voltage to the unselected page. The memory device 100 may determine that a program state of a memory cell that is an ON cell among memory cells other than the memory cells having the zeroth program state P0 is a first program state P1.

The memory device 100 may apply a third read voltage R3 to the selected page and apply a pass voltage to the unselected page. Here, the memory device 100 may determine that a program state of a memory cell that is an ON cell among memory cells other than the memory cells having the zeroth program state P0 or the first program state P1 is a second program state P2. In a manner similar to the foregoing, a fourth read voltage R4 to a seventh read voltage R7 may be successively applied so that program states of the memory cells may be determined.

FIG. 5B is a diagram for describing a Gray code in accordance with an embodiment.

Referring to FIG. 5B, a table 520 may show a relationship between values according to a program state P0 to P7, a read voltage R1 to R7, a data type MSB to LSB, and a gray code. In an embodiment, one of bit values according to a data storage scheme may be allocated to each of the plurality of program states P0 to P7. The plurality of program states P0 to P7 illustrated in FIG. 5B illustrate an example of the case of the TLC. If the data storage scheme is changed to the SLC or MLC storage scheme, a value allocated to each program state may be changed.

In an embodiment, in the case of the TLC, a value binarized by three bits may be allocated to each of the plurality of program states P0 to P7 according to a Gray code of '7310-2645', as illustrated in FIG. 5B. For example, a value of '111' may be allocated to the zeroth program state P0. A value of '011' may be allocated to the first program state P1. A value of '001' may be allocated to the second program state P2. A value of '000' may be allocated to the third program state P3. A value of '010' may be allocated to the fourth program state P4. A value of '110' may be allocated to the fifth program state P5. A value of '100' may be allocated to the sixth program state P6. A value of '101' may be allocated to the seventh program state P7.

In the case of the TLC, one memory cell may store three bits. Here, the three bits may include an MSB, a CSB, and an LSB. If a memory cell basis expands to a page basis, one page may store three pieces of page data such as LSB page data, CSB page data, and MSB page data.

Here, a read voltage set corresponding to the type of data may be preset. The read voltage set may include at least one read voltage. For example, a first read voltage set provided to read the MSB page data may include a first read voltage R1 and a fifth read voltage R5. A second read voltage set provided to read the CSB page data may include a second read voltage R2, a fourth read voltage R4, and a sixth read voltage R6. A third read voltage set provided to read the LSB page data may include a third read voltage R3 and a seventh read voltage R7.

In the case of an operation of reading the CSB page data, the memory device 100 may apply a second read voltage R2 to a selected page and apply a pass voltage to an unselected page. Here, the memory device 100 may determine that a value of each CSB stored in memory cells that are ON cells among memory cells included in the selected page is '1'. Here, the memory cells that are the ON cells may have the zeroth program state P0 or the first program state P1.

The memory device 100 may apply a fourth read voltage R4 to the selected page and apply a pass voltage to the unselected page. Here, the memory device 100 may determine that a value of each CSB stored in memory cells that are ON cells among undetermined memory cells included in the selected page is '0'. Here, the memory cells that are the ON cells may have the second program state P2 or the third program state P3.

The memory device 100 may apply a sixth read voltage R6 to the selected page and apply a pass voltage to the unselected page. Here, the memory device 100 may determine that a value of each CSB stored in memory cells that are ON cells among undetermined memory cells included in the selected page is '1'. Here, the memory cells that are the ON cells may have the fourth program state P4 or the fifth program state P5. Furthermore, the memory device 100 may determine that a value of each CSB stored in memory cells that are OFF cells among undetermined memory cells included in the selected page is '0'. Here, the memory cells that are the OFF cells may have the sixth program state P6 or the seventh program state P7.

Figure 5C:
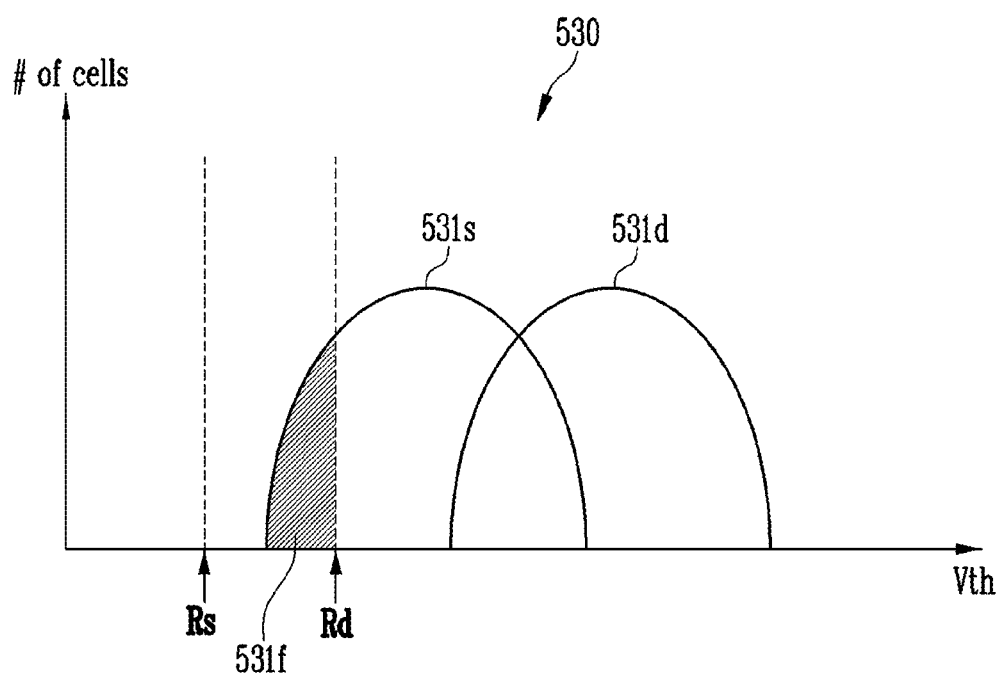
FIG. 5C is a diagram for describing a fail bit in accordance with an embodiment.

FIG. 5C is a diagram for describing a fail bit in accordance with an embodiment.

Referring to FIG. 5C, the threshold voltages of the memory cells may vary because of disturbance, retention, or an increase in erase write cycle count. For example, as shown in the threshold voltage distribution change 530 of FIG. 5C, it will be assumed that the N-th memory cells among the memory cells included in the selected page are changed from a first threshold voltage distribution 531d to a second threshold voltage distribution 531s.

In an embodiment, the N-th memory cells included in a selected page may be programmed to have the first threshold voltage distribution 531d. In this case, if a read voltage having a default level Rd is applied to the selected page, the N-th memory cells may not be determined to be ON cells because the levels of the threshold voltages of the N-th memory cells are greater than the default level Rd of the read voltage. Here, the default level Rd may be a preset level.

Thereafter, the N-th memory cells may be changed to the second threshold voltage distribution 531s. In this case, a read voltage having the default level Rd is applied to the selected page, some memory cells 531f of the N-th memory cells included in the selected page may be determined to be ON cells because the levels of the threshold voltages of the memory cells 531f are less than the default level Rd of the read voltage. Here, the some memory cells 531f may refer to fail bits in which the program state has changed.

The error correction circuit 250 or the control logic 130 may determine the fail bit number by counting the number of memory cells of which the program state has changed. For example, in the case of the TLC, each of 8000 memory cells included in one page may be programmed to have one program state of the zeroth program state P0 to the seventh program state P7. Here, the memory cells may be programmed such that 1000 memory cells belong to each of the zeroth program state P0 to the seventh program state P7. In this case, the number of memory cells that are determined to be ON cells by the application of the second read voltage R2 may be 2000. Thereafter, on the assumption that the threshold voltages of the memory cells are changed and the number of memory cells that are determined to be ON cells by the application of the second read voltage R2 is 2200, the fail bit number pertaining to the second read voltage R2 may be 200 because the number of memory cells has changed from 2000 to 2200. Here, the fail bit number may be stored in the CAM block of the memory device 100 or the memory 230 of the memory controller 200.

In a case for which there is a difference between the number of times read voltages are applied to read a specific type of data such as CSB page data and the number of times read voltages are applied to read other types of data such as MSB page data or LSB page data, the degree to which fail bits occur may be changed.

In the present disclosure, the level of a read voltage may be adjusted from the default level Rd to a shift level Rs based on the read voltage table including a voltage variation, etc., so that the number of fail bits may be reduced even if the threshold voltage of the memory cells vary.

FIGS. 6A and 6B are diagrams for describing the first read voltage table in accordance with an embodiment.

Referring to FIGS. 6A and 6B, the voltage register 243 may store a first read voltage table 610, 620. The first read voltage table 610, 620 may be a table indicating a mapping relationship between an erase write cycle count, a reference fail bit number, and a voltage variation. Here, the mapping relationship may refer to a relationship such as the same row or the same column.

In detail, the first read voltage table 610, 620 may include first field values 611 corresponding to an erase write cycle count, second field values 613 mapped to the first field values 611 and corresponding to the reference fail bit number, and a plurality of voltage variations 615 mapped to the second field values 613.

Referring to FIG. 6B, it is assumed that the data storage scheme is a TLC storage scheme, a fail bit number pertaining to the second read voltage for reading the CSB page data is 2000, a fail bit number pertaining to the fourth read voltage is 3400, a fail bit number pertaining to the sixth read voltage is 2500, and an erase write cycle count for the selected page is 80.

In this case, the read voltage controller 245 may select '100' that is a first field value 621 having the smallest difference between it and the erase write cycle count of '80', among the first field values.

The read voltage controller 245 determines that the reference fail bit number is '3400' that is the largest fail bit number among the fail bit number of the second read voltage, the fail bit number of the fourth read voltage, and the fail bit number of the sixth read voltage. In this case, the read voltage controller 245 may select '3500' that is a second field value 624 having the smallest difference between it and the reference fail bit number of '3400', among the second field values disposed on the same column as that of the selected first field value 621 of '100'.

In this case, the read voltage controller 245 may select, as the reference voltage variation, a voltage variation 625 of '−240' disposed on the same row as that of the selected second field value 624 of '3500'. In an embodiment, the level of the read voltage may be adjusted using the reference voltage variation as the final voltage variation. In this case, the read voltage controller 245 may adjust the level of each of the plurality of read voltages to a value obtained by multiplying the reference voltage variation of '−240' by a corresponding one of the ratio values. In an embodiment, the final voltage variation may be determined using the reference voltage variation and the second read voltage table or the third read voltage table.

FIG. 6C is a diagram for describing the second read voltage table in accordance with an embodiment.

Referring to FIG. 6C, the voltage register 243 may store a second read voltage table 630. The second read voltage table 630 may be a table indicating a mapping relationship between the type of data, a reference voltage variation, and a second voltage variation. For example, the second read voltage table 630 may include third field values 631 corresponding to the types of data, fourth field values 633 corresponding to the reference voltage variation, and second voltage variations 635 mapped to the third field values 631 and the fourth field values 633.

For example, it is assumed that the data storage scheme is a TLC storage scheme, CSB page data is read, and the reference voltage variation is determined to be '−240' based on the first read voltage table.

In this case, the read voltage controller 245 may select 'CSB' that is a third field value 632 corresponding to data type 'CSB' among the third field values 631 included in the second read voltage table 630. The read voltage controller 245 may select '−240' that is a fourth field value 634 corresponding to the reference voltage variation of '−240' among the fourth field values 633 included in the second read voltage table 630.

In this case, the read voltage controller 245 may select, as the final voltage variation, '−120' that is a second voltage variation 636 mapped to the selected third field value 632 of 'CSB' and the selected fourth field value 634 of '−240' among the second voltage variations 635 included in the second read voltage table 630.

In this case, the read voltage controller 245 may adjust the level of each of the plurality of read voltages to a value obtained by multiplying the second voltage variation 636 of '−120' that is the final voltage variation by a corresponding one of the ratio values.

FIG. 6D is a diagram for describing the third read voltage table in accordance with an embodiment.

Referring to FIG. 6D, the voltage register 243 may store a third read voltage table 640. The third read voltage table 640 may be a table indicating a mapping relationship between an erase write cycle count, a reference voltage variation, and a third voltage variation. For example, the third read voltage table 640 may include fifth field values 641 corresponding to the erase write cycle count, sixth field values 643 corresponding to the reference voltage variation, and third voltage variations 645 mapped to the fifth field values 641 and the sixth field values 643.

For example, it is assumed that the data storage scheme is a TLC storage scheme, CSB page data is read, the erase write cycle count on a selected page is 800, and the reference voltage variation is determined to be '−240' based on the first read voltage table.

In this case, the read voltage controller 245 may select '1000' that is a fifth field value 642 having the smallest difference between it and the erase write cycle count of '800', among the fifth field values 641 included in the third read voltage table 640. The read voltage controller 245 may select '−240' that is a sixth field value 644 corresponding to the reference voltage variation of '−240' among the sixth field values 643 included in the third read voltage table 640.

In this case, the read voltage controller 245 may select, as the final voltage variation, '−120' that is a third voltage variation 646 mapped to the selected fifth field value 642 of '1000' and the selected sixth field value 644 of '−240' among the third voltage variations 645 included in the third read voltage table 640.

In this case, the read voltage controller 245 may adjust the level of each of the plurality of read voltages to a value obtained by multiplying the third voltage variation 646 of '−120' that is the final voltage variation by a corresponding one of the ratio values.

In an embodiment, a difference between third voltage variations mapped to the fifth field value indicating a first erase write cycle count among the fifth field values 641 included in the third read voltage table 640 may be greater than a difference between third voltage variations mapped to a fifth field value indicating a second erase write cycle count greater than the first erase write cycle count. For example, a difference between voltage variations mapped to a column in which the erase write cycle count is '1000' may be 20. A difference between voltage variations mapped to a column in which the erase write cycle count is '3000' greater than '1000' may be 10.

FIG. 7A is a diagram for describing a read voltage of a read retry operation in accordance with an embodiment.

Referring to FIG. 7A, the memory controller 200 or the memory device 100 may store a read retry table 710 to be used to perform a read operation according to a read retry scheme. For example, the read retry table 710 may be stored in the voltage register 243 of the memory controller 200 or the CAM block of the memory device 100.

The read retry table 710 may include a plurality of indexes RR1 to RR3. The plurality of indexes RR1 to RR3 may indicate a sequence of read operations according to the read retry scheme. The read retry table 710 may include default level information R1_1 to R7_3. The default level information R1_1 to R7_3 may indicate a default level of an M-th read voltage mapped to an N-th index. The default level may be a preset value.

For example, in a case for which the memory device 100 performs a first read operation according to the read retry scheme, the memory device 100 may adjust the plurality of read voltages R1 to R7 to default levels 711 mapped to the first index RR1 and perform the first read operation. Thereafter, in a case for which the first read operation fails and the memory device 100 performs a second read operation according to the read retry scheme, the memory device 100 may adjust the plurality of read voltages R1 to R7 to default levels 712 mapped to the second index RR2 and perform the second read operation. As such, each time the read operation fails, the memory device 100 may adjust the read voltages to the default levels mapped to the corresponding index according to the index sequence under the control of the memory controller 200 and then perform the read oration.

In the present disclosure, in a case for which the read operation is performed by the read retry scheme, a variable level rather than a fixed level may be applied to the read voltage even under the same index. This will be described with reference to FIGS. 7B and 7C.

FIGS. 7B and 7C are diagrams for describing a method of adjusting the read voltage of the read retry operation in accordance with an embodiment.

Referring to FIGS. 7B and 7C, the memory controller 200 may store a read retry table 720 to be used to perform a read operation according to a read retry scheme. For example, the read retry table 720 may be stored in the voltage register 243 of the memory controller 200 or the CAM block of the memory device 100.

The read retry table 720 may include a plurality of indexes RR1 to RR3. The read retry table 710 may include default level information R1_1 to R7_3 and read voltage information Vt1 to Vt7. Here, the read voltage information Vt1 to Vt7 may indicate a level for adjusting a default level of an M-th read voltage mapped to an N-th index. The read voltage information Vt1 to Vt7 may be determined using the foregoing read voltage table.

For example, it is assumed that the data storage scheme is a TLC storage scheme, and a read operation of reading CSB page data according to the read retry scheme is performed. It is assumed that the a second fail bit number FBIT_2 of the second read voltage R2 is '2000', a fourth fail bit number FBIT_4 of the fourth read voltage R4 is '3400', a sixth fail bit number FBIT_6 of the sixth read voltage R6 is '2500', and a reference voltage variation Va is determined to be '−240' based on the first read voltage table. Here, '3400' that is the largest value among the second fail bit number FBIT_2, the fourth fail bit number FBIT_4, and the sixth fail bit number FBIT_6 may be determined as the reference fail bit number. Here, as illustrated in FIG. 7B, in the read retry table 720, data 721, 722, and 723 of a row mapped to the second read voltage R2, the fourth read voltage R4, and the sixth read voltage R6 may be used to read the CSB page data.

In this case, the second read voltage information Vt2 may include a level obtained by multiplying a ratio value of the second fail bit number FBIT_2 of '2000' and the reference fail bit number of '3400' by the reference voltage variation Va of '−240'. The fourth read voltage information Vt4 may include a level obtained by multiplying a ratio value of the fourth fail bit number FBIT_4 of '3400' and the reference fail bit number of '3400' by the reference voltage variation Va of '−240'. The sixth read voltage information Vt6 may include a level obtained by multiplying a ratio value of the sixth fail bit number FBIT_6 of '2500' to the reference fail bit number of '3400' by the reference voltage variation Va of '−240'.

For example, in the case of the fourth read voltage R4 in the first index RR1, if the default level information of the fourth read voltage R4 indicates 2V and the fourth read voltage information Vt4 indicates −240 my, the memory device 100 may perform the read operation using the fourth read voltage R4 adjusted to a level of 1.76 V under the control of the memory controller 200. The level of each of the second read voltage R2 and the sixth read voltage R6 may also be adjusted in the same manner as that of the foregoing, and the read operation may thereafter be performed.

FIG. 8 is a diagram for describing a method of operating the memory controller 200 in accordance with an embodiment.

Referring to FIG. 8, the method of operating the memory controller 200 may include step S810 of controlling the memory device 100 to perform a normal read operation based on a plurality of read voltages having different levels, step S820 of determining fail bit numbers corresponding to the respective read voltages, step S830 of determining a reference voltage variation from among a plurality of voltage variations included in a read voltage table, based on a reference fail bit number that refers to the largest fail bit number of the fail bit numbers and on an erase write cycle count of the memory device, and step S840 of adjusting the level of each of the plurality of read voltages using a ratio value of a corresponding one of the fail bit numbers to the reference fail bit number and the reference voltage variation.

In detail, the method of operating the memory controller 200 may include controlling the memory device 100 to perform a normal read operation based on a plurality of read voltages having different levels (at step S810).

In an embodiment, the plurality of read voltages may be voltages to read the same type of data.

Fail bit numbers corresponding to the respective read voltages may be determined (at step S820).

The reference voltage variation may be determined from among the plurality of voltage variations included in the read voltage table, based on the reference fail bit number and the erase write cycle count of the memory device 100 (at step S830). Here, the reference fail bit number may refer to the largest fail bit number of the fail bit numbers.

In an embodiment, the step of determining the reference voltage variation may include setting, to the reference voltage variation, a voltage variation matching the type of data read by the plurality of read voltages, the reference fail bit number, and the erase write cycle count, among the plurality of voltage variations included in the read voltage table.

The level of each of the plurality of read voltages may be adjusted using a ratio value of a corresponding one of the fail bit numbers to the reference fail bit number and the reference voltage variation (at step S840).

In an embodiment, the method of operating the memory controller 200 may further include the step of determining whether the normal read operation has failed based on the fail bit numbers, and controlling, if the normal read operation has failed, the memory device 100 to read data by the plurality of read voltages having respective adjusted levels.

In an embodiment, the step of determining whether the normal read operation has failed based on the fail bit numbers may include the step of determining that the normal read operation has failed if a total bit number obtained by the sum of the fail bit numbers exceeds a preset threshold value, and determining that the normal read operation has succeeded if the total bit number is the threshold value or less.

Figure 9:
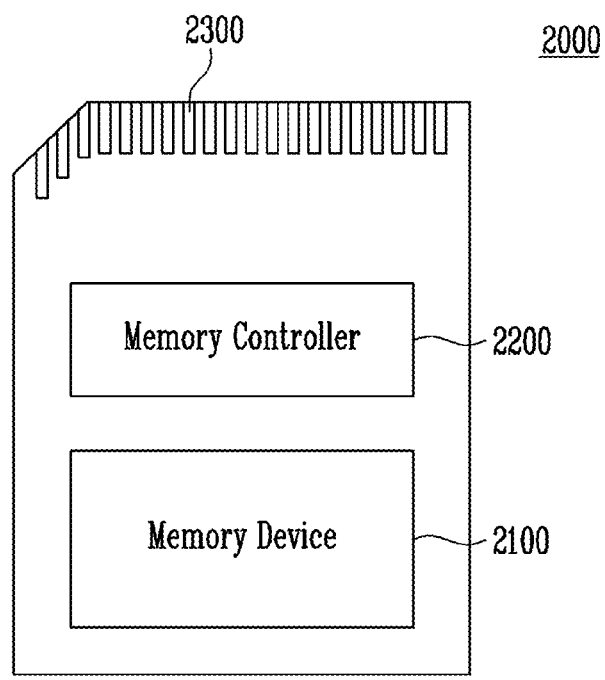
FIG. 9 is a block diagram illustrating a memory card to which a memory system in accordance with an embodiment is applied.

FIG. 9 is a block diagram illustrating a memory card 2000 to which the memory system in accordance with an embodiment is applied.

Referring to FIG. 9, the memory card 2000 may include a memory device 2100, a memory controller 2200, and a connector 2300.

The memory device 2100 may perform a program operation of storing data, a read operation of reading data, and an erase operation of erasing data. In an embodiment, the memory device 2100 may be formed of various nonvolatile memory devices using, for example, electrically erasable and programmable ROM (EEPROM), NAND flash memory, NOR flash memory, phase-change RAM (PRAM), resistive RAM (ReRAM), ferroelectric RAM (FRAM), and/or spin transfer torque magnetic RAM (STT-MRAM). The description of the memory device 100 explained with reference to FIG. 1 or the like may be identically applied to the memory device 2100, and hereinafter redundant description will be omitted.

The memory controller 2200 may control the memory device 2100. For example, the memory controller 2200 may execute an instruction for controlling the memory device 2100. The memory controller 2200 may control the memory device 2100 to perform a program operation, a read operation, or an erase operation. The memory controller 2200 may transmit data, a command, or the like to the memory device 2100 or the host 20 through communication therebetween. In an embodiment, the memory controller 2200 may include components such as a random access memory (RAM) component, a processing unit, a host interface, a memory interface, and an error correction circuit. The description of the memory controller 200 explained with reference to FIG. 1, etc. may be identically applied to the memory controller 2200, and hereinafter redundant description will be omitted.

The memory controller 2200 may communicate with an external device through the connector 2300. The memory controller 2200 may communicate with an external device (e.g., a host) based on a specific communication protocol. In an embodiment, the memory controller 2200 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols. The memory device 2100 and the memory controller 2200 may be integrated into a single semiconductor device to form a memory card. For example, the memory device 2100 and the memory controller 2200 may be integrated into a single semiconductor device to form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

Figure 10:
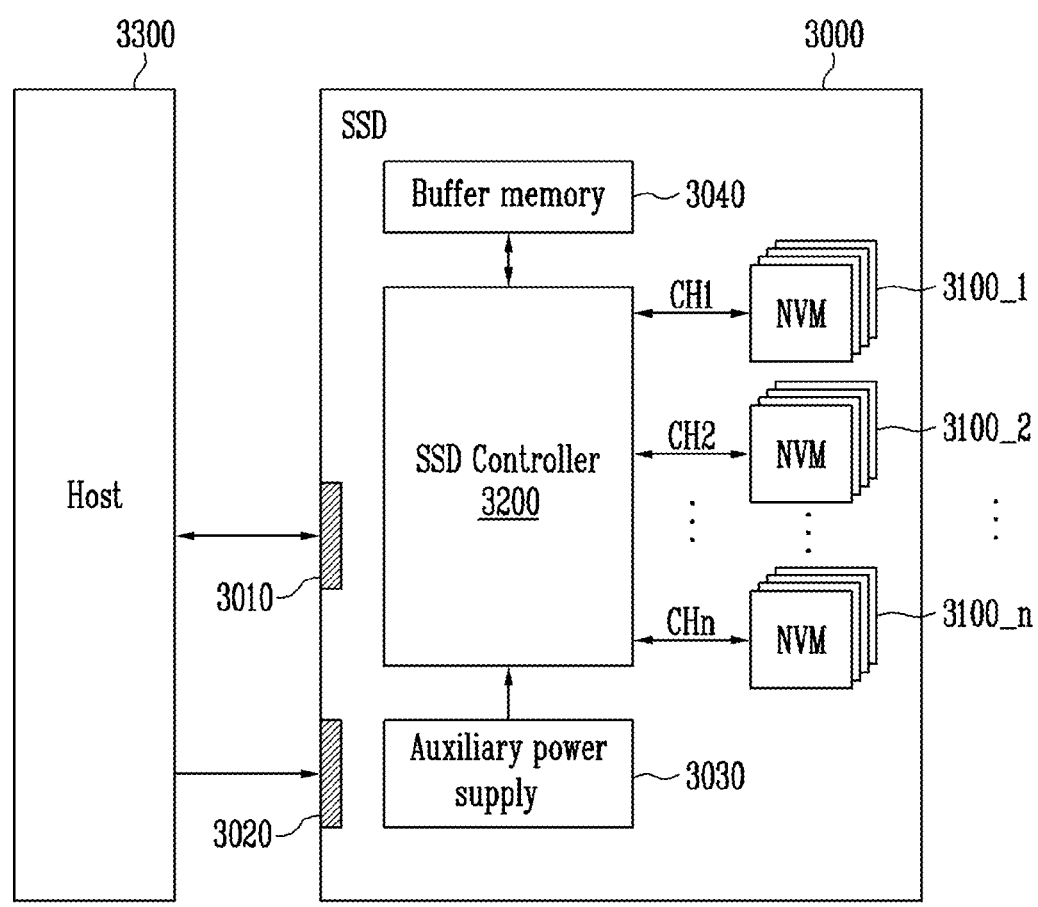
FIG. 10 is a block diagram illustrating a solid state drive (SSD) system to which a memory system in accordance with an embodiment is applied.

FIG. 10 is a block diagram illustrating a solid state drive (SSD) system 3000 to which the memory system in accordance with an embodiment is applied.

Referring to FIG. 10, the SSD system 3000 may include a plurality of nonvolatile memory devices 3100_1 to 3100_n, an SSD controller 3200, a signal connector 3010, an auxiliary power supply 3030, and buffer memory 3040.

The SSD system 3000 may perform communication with the host 3300 through the signal connector 3010. The signal connector 3010 may be implemented in the form of an interface according to various communication schemes. For example, the signal connector 3010 may be one of interfaces such as a serial ATA (SATA) interface, a mini-SATA (mSATA) interface, a PCIe (PCI express) interface, and an M.2 interface according to various communication schemes.

A plurality of first nonvolatile memory devices 3100_1 may be connected to the SSD controller 3200 through a first channel CH1. A plurality of second nonvolatile memory devices 3100_2 may be connected to the SSD controller 3200 through a second channel CH2. A plurality of n-th nonvolatile memory devices 3100_n may be connected to the SSD controller 3200 through an n-th channel CHn. Hence, the SSD controller 3200 may perform communication in parallel with the nonvolatile memory devices through the channels independent from each other.

The description of the memory device 100 explained with reference to FIG. 1 or the like may be identically applied to each of the plurality of nonvolatile memory devices 3100_1 to 3100_n, and hereinafter redundant description will be omitted. The description of the memory controller 200 explained with reference to FIG. 1, etc. may be identically applied to the SSD controller 3200, and hereinafter redundant description will be omitted.

The SSD system 3000 may be supplied with external power from the host 3300 through the power connector 3020. The auxiliary power supply 3030 may be connected with the host 3300 through the power connector 3020. The auxiliary power supply 3030 may be supplied with power from the host 3300, and may be charged by the power. The auxiliary power supply 3030 may provide the power of the SSD system 3000 when the supply of power from the host 3300 is not smoothly performed. For example, the auxiliary power supply 3030 may be positioned inside the SSD system 3000 or positioned outside the SSD system 3000. For instance, the auxiliary power supply 3030 may be disposed on a main board and may supply auxiliary power to the SSD system 3000.

The buffer memory 3040 may operate as a buffer memory of the SSD 3000. For example, the buffer memory 3040 may temporarily store data received from the host 3300 or data received from the plurality of nonvolatile memory devices 3100_1 to 3100_n or may temporarily store metadata (e.g., a mapping table) of the nonvolatile memory devices 3100_1 to 3100_n. The buffer memory 3040 may include volatile memory such as DRAM, SDRAM, DDR SDRAM, LPDDR SDRAM, and/or GDRAM or nonvolatile memory such as FRAM, ReRAM, STT-MRAM, and/or PRAM.

Figure 11:
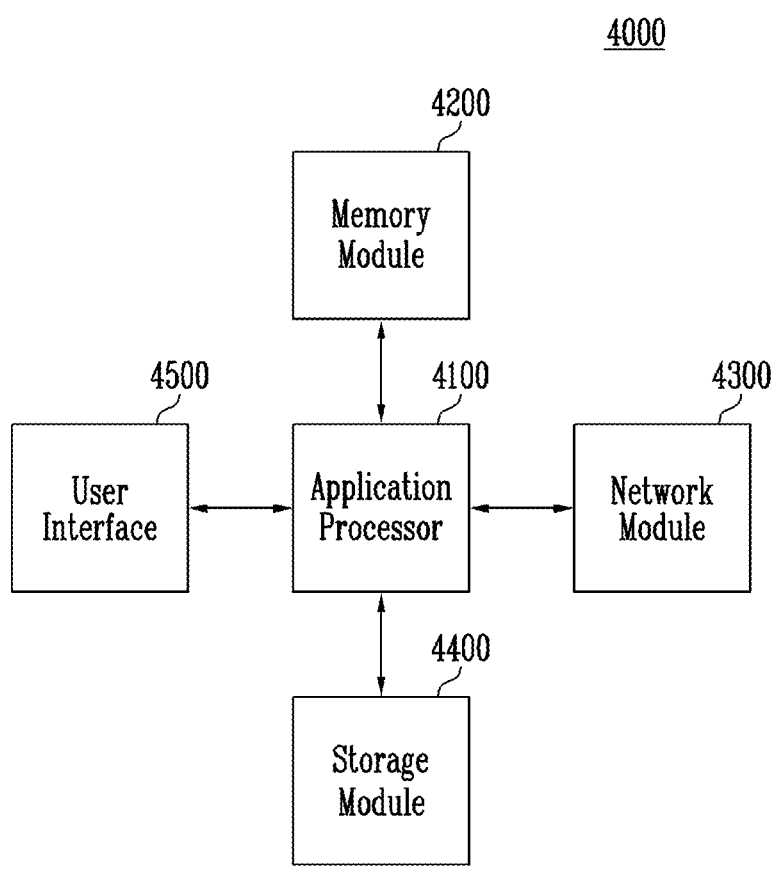
FIG. 11 is a block diagram illustrating a user system to which a memory system in accordance with an embodiment is applied.

FIG. 11 is a block diagram illustrating a user system 4000 to which the memory system in accordance with an embodiment is applied.

Referring to FIG. 11, the user system 4000 may include an application processor 4100, a memory module 4200, a network module 4300, a storage module 4400, and a user interface 4500.

The application processor 4100 may run components included in the user system 4000, an operating system (OS), or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as main memory, working memory, buffer memory, or cache memory of the user system 4000. The memory module 4200 may include volatile RAM such as a DRAM, SDRAM, DDR SDRAM, DDR2 SDRAM, DDR3 SDRAM, LPDDR SDARM, LPDDR2 SDRAM, and/or LPDDR3 SDRAM, or nonvolatile RAM such as PRAM, ReRAM, MRAM, and/or FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as code division multiple access (CDMA), global system for mobile communication (GSM), wideband CDMA (WCDMA), CDMA-2000, time division multiple access (TDMA), long term evolution (LTE), WiMAX, WLAN, UWB, Bluetooth, or Wi-Fi communication. In an embodiment, the network module 4300 may be included in the application processor 4100.

The storage module 4400 may store data therein. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device using, for example, phase-change RAM (PRAM), magnetic RAM (MRAM), resistive RAM ReRAM, NAND flash memory, NOR flash memory, or NAND flash memory having a three-dimensional (3D) structure. In an embodiment, the storage module 4400 may be provided as a removable storage medium (i.e., removable drive), such as a memory card or an external drive of the user system 4000.

In an embodiment, the description of the memory system 10 explained with reference to FIG. 1, etc. may be identically applied to the storage module 4400. For example, the storage module 4400 may include a plurality of nonvolatile memory devices. Here, the description of the memory device 100 explained with reference to FIG. 1 may be identically applied to each of the plurality of nonvolatile memory devices.

The user interface 4500 may include interfaces for inputting data or instructions to the application processor 4100 or outputting data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as an a liquid crystal display (LCD), an organic light emitting Diode (OLED) display device, an active matrix OLED (AMOLED) display device, an LED, a speaker, a monitor, and so on.

Various embodiments of the present disclosure may provide a memory controller capable of correctly reading data stored in a memory device, and a memory system including the memory controller, and a method of operating the memory system.

In the present disclosure, data may be correctly read by adjusting (or changing) a read voltage depending on an erase write cycle count. In the present disclosure, data may be correctly read by adjusting (or changing) a read voltage depending on a fail bit number. In the present disclosure, data may be correctly read by adjusting (or changing) a read voltage depending on the type of data.

In the present disclosure, an optimized read voltage may be rapidly determined, and the lifetime of the device may be enhanced. Furthermore, the number of times read retry operations are performed may be reduced, and the time it takes to read correct data may be reduced.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory controller comprising:
a read operation controller configured to control a memory device to read pieces of data from a selected page of the memory device by a plurality of read voltages having different levels;
an error correction circuit configured to determine fail bit numbers of the pieces of data, each of the fail bit numbers indicating a number of failed bits included in one of the pieces of data;
a read voltage controller configured to:
select a reference voltage variation from among a plurality of voltage variations included in a first read voltage table, based on an erase write cycle count of the selected page, and a reference fail bit number indicating a largest fail bit number of the fail bit numbers, and
adjust a level of each of the plurality of read voltages based on the selected reference voltage variation and a ratio value of a corresponding one of the fail bit numbers to the reference fail bit number; and
a voltage register capable of storing the first read voltage table, the first read voltage table including:
first field values corresponding to the erase write cycle count;
second field values mapped to the first field values and corresponding to the reference fail bit number; and
the plurality of first voltage variations mapped to the second field values.

2. The memory controller according to claim 1, wherein the read voltage controller is capable of:

selecting a first field value having a smallest difference between the first field value and the erase write cycle count from among the first field values,
selecting a second field value mapped to the selected first field value and having a smallest difference between the second field value and the reference fail bit number from among the second field values, and
selecting, as the reference voltage variation, a first voltage variation mapped to the selected second field value from among the plurality of first voltage variations.

3. The memory controller according to claim 2, wherein the voltage register is capable of storing a second read voltage table including:
third field values corresponding to a type of data;
fourth field values corresponding to the reference voltage variation; and
a plurality of second voltage variations mapped to the third field values and the fourth field values.

4. The memory controller according to claim 3, wherein the read voltage controller is capable of:
selecting a third field value corresponding to a type of the pieces of data from among the third field values;
selecting a fourth field value corresponding to the reference voltage variation from among the fourth field values;
selecting a second voltage variation mapped to the selected third field value and the selected fourth field value from among the plurality of second voltage variations; and
adjusting a level of each of the plurality of read voltages to a value obtained by multiplying the selected second voltage variation by a corresponding one of the ratio values.

5. The memory controller according to claim 2, wherein the voltage register is capable of storing:
a third read voltage table including fifth field values corresponding to the erase write cycle count;
sixth field values corresponding to the reference voltage variation; and
a plurality of third voltage variations mapped to the fifth field values and the sixth field values.

6. The memory controller according to claim 5, wherein the read voltage controller is capable of:
selecting a fifth field value having a smallest difference between the fifth field value and the erase write cycle count from among the fifth field values;
selecting a sixth field value corresponding to the reference voltage variation from among the sixth field values;
selecting a third voltage variation mapped to the selected fifth field value and the selected sixth field value from among the third voltage variations; and
adjusting a level of each of the plurality of read voltages to a value obtained by multiplying the selected third voltage variation by a corresponding one of the ratio values.

7. The memory controller according to claim 5, wherein a difference between third voltage variations mapped to the fifth field value indicating a first erase write cycle count among a fifth field values is greater than a difference between third voltage variations mapped to a fifth field value indicating a second erase write cycle count greater than the first erase write cycle count.

8. The memory controller according to claim 1,
wherein the read operation controller is capable of controlling the memory device to read pieces of data from the selected page by the plurality of read voltages each having the adjusted level.

9. The memory controller according to claim 1,
wherein the plurality of read voltages are voltages to read an identical type of data.

10. A memory system comprising:
a memory device including a plurality of pages; and
a memory controller configured to:
control the memory device to apply a plurality of read voltages having different levels to a selected page of the plurality of pages,
determine a reference voltage variation of a plurality of voltage variations included in a read voltage table, based on an erase write cycle count of the selected page, and a reference fail bit number indicating a largest fail bit number of fail bit numbers obtained by the respective read voltages, and
adjust a level of each of the plurality of read voltages, based on a ratio value of a corresponding one of the fail bit numbers to the reference fail bit number and the reference voltage variation,
wherein the memory controller comprises a voltage register capable of storing the read voltage table, the read voltage table including:
first field values corresponding to the erase write cycle count;
second field values mapped to the first field values and corresponding to the reference fail bit number; and
the plurality of voltage variations mapped to the second field values.

11. The memory system according to claim 10,
wherein the memory controller is configured to set, to the reference voltage variation, a voltage variation matching a type of the pieces of data read by the plurality of read voltages, the reference fail bit number, and the erase write cycle count, among the plurality of voltage variations included in the read voltage table.

12. The memory system according to claim 10,
wherein the memory controller comprises a read operation controller capable of controlling the memory device to apply the plurality of read voltages each having the adjusted level to the selected page.

13. The memory system according to claim 10,
wherein the plurality of read voltages are voltages to read an identical type of data.

14. A method of operating a memory controller, the method comprising:
controlling a memory device to perform a normal read operation based on a plurality of read voltages having different levels;
determining fail bit numbers respectively corresponding to the plurality of read voltages, each of the fail bit numbers indicating a number of failed bits included in one of the pieces of data;
determining a reference voltage variation of a plurality of voltage variations included in a read voltage table, based on an erase write cycle count of the memory device, and a reference fail bit number indicating a largest fail bit number of the fail bit numbers; and
adjusting a level of each of the plurality of read voltages, based on a ratio value of a corresponding one of the fail bit numbers to the reference fail bit number and the reference voltage variation,
wherein the read voltage table includes:
first field values corresponding to the erase write cycle count;
second field values mapped to the first field values and corresponding to the reference fail bit number; and
the plurality of voltage variations mapped to the second field values.

15. The method according to claim 14,
wherein determining the reference voltage variation comprises setting, to the reference voltage variation, a voltage variation matching a type of data read by the plurality of read voltages, the reference fail bit number, and the erase write cycle count, among the plurality of voltage variations included in the read voltage table.

16. The method according to claim 14, further comprising:
determining whether the normal read operation has failed, based on the fail bit numbers; and
controlling, when the normal read operation has failed, the memory device such that pieces of data are read by the plurality of read voltages each having the adjusted level.

17. The method according to claim 16, wherein determining whether the normal read operation has failed, based on the fail bit numbers comprises:
determining that the normal read operation has failed when a total bit number obtained by a sum of the fail bit numbers exceeds a preset threshold value; and
determining that the normal read operation has succeeded when the total bit number is the present threshold value or less.

18. The method according to claim 14,
wherein the plurality of read voltages are voltages to read an identical type of data.

* * * * *